United States Patent
Yang et al.

(10) Patent No.: US 10,734,938 B2
(45) Date of Patent: Aug. 4, 2020

(54) PACKAGING FOR SOLAR ROOF TILES

(71) Applicant: TESLA, INC., Palo Alto, CA (US)

(72) Inventors: Bobby Yang, Dublin, CA (US); Peter P. Nguyen, San Jose, CA (US); Seth M. Winger, Palo Alto, CA (US); Piotr Zajac, Foster City, CA (US); Kaleb A. Klauber, Oakland, CA (US); Jennifer L. Wang, San Jose, CA (US); Jiunn Benjamin Heng, Los Altos Hills, CA (US)

(73) Assignee: Tesla, Inc., Palo Alto, CA (US)

( * ) Notice: Subject to any disclaimer, the term of this patent is extended or adjusted under 35 U.S.C. 154(b) by 115 days.

(21) Appl. No.: 15/656,794

(22) Filed: Jul. 21, 2017

(65) Prior Publication Data

US 2019/0028055 A1 Jan. 24, 2019

(51) Int. Cl.
*H02S 20/25* (2014.01)
*H02S 40/34* (2014.01)
(Continued)

(52) U.S. Cl.
CPC .............. *H02S 20/25* (2014.12); *E04D 1/30* (2013.01); *H01L 31/0201* (2013.01);
(Continued)

(58) Field of Classification Search
CPC .......... H02S 20/25; H02S 40/36; H02S 40/34; H01L 31/0504; H01L 31/0201;
(Continued)

(56) References Cited

U.S. PATENT DOCUMENTS

| 3,076,861 A | 2/1963 | Samulon |
| 3,369,939 A | 2/1968 | Myer |

(Continued)

FOREIGN PATENT DOCUMENTS

| CN | 102544380 | 8/2015 |
| CN | 103426957 | 3/2016 |

(Continued)

OTHER PUBLICATIONS

Pelisset: "Efficiency of Silicon Thin-Film photovoltaic Modules with a Front Coloured Glass", Preceedings CISBAT 2011, Jan. 1, 2011, pp. 37-42, XP055049695, the Whole Document.
(Continued)

*Primary Examiner* — Patrick J Maestri
*Assistant Examiner* — Joseph J. Sadlon
(74) *Attorney, Agent, or Firm* — Dentons US LLP

(57) ABSTRACT

One embodiment provides a solar roof tile module. The module includes a plurality of solar roof tiles positioned side by side and one or more tile spacers. The tiles are electrically and mechanically coupled to each other. A tile spacer is positioned between two adjacent solar roof tiles, thereby preventing water leakage. A solar roof tile can include a front cover, a back cover, and a plurality of photovoltaic strips positioned between the front and back covers. Each photovoltaic strip includes a first edge busbar located on an edge of a first surface and a second edge busbar located on an opposite edge of a second surface, and the photovoltaic strips are arranged in such a way that the first edge busbar of a photovoltaic strip overlaps with a second edge busbar of an adjacent photovoltaic strip, thereby forming a serial connection among the photovoltaic strips.

16 Claims, 16 Drawing Sheets

(51) Int. Cl.
*H01L 31/02* (2006.01)
*H01L 31/048* (2014.01)
*E04D 1/30* (2006.01)
*H01L 31/05* (2014.01)
*H02S 40/36* (2014.01)
*E04D 12/00* (2006.01)

(52) U.S. Cl.
CPC ...... *H01L 31/0488* (2013.01); *H01L 31/0504* (2013.01); *H02S 40/34* (2014.12); *H02S 40/36* (2014.12); *E04D 12/004* (2013.01); *E04D 2001/308* (2013.01)

(58) Field of Classification Search
CPC ..... H01L 31/0488; E04D 1/30; E04D 12/004; E04D 2001/308
USPC ...................................................... 52/173.3
See application file for complete search history.

(56) References Cited

U.S. PATENT DOCUMENTS

| | | | | |
|---|---|---|---|---|
| 3,459,391 | A | * | 8/1969 | Haynos ............... H01L 25/03 |
| | | | | 244/172.7 |
| 3,461,602 | A | | 8/1969 | Heinz |
| 4,239,810 | A | | 12/1980 | Alameddine |
| 4,724,011 | A | | 2/1988 | Turner |
| 5,118,540 | A | | 6/1992 | Hutchison |
| 5,338,369 | A | | 8/1994 | Rawlings |
| 5,427,961 | A | | 6/1995 | Takenouchi |
| 5,571,338 | A | * | 11/1996 | Kadonome ........... E04D 3/3608 |
| | | | | 136/251 |
| 5,590,495 | A | * | 1/1997 | Bressler .............. H01L 31/048 |
| | | | | 136/244 |
| 5,667,596 | A | | 9/1997 | Tsuzuki |
| 5,919,316 | A | * | 7/1999 | Bogorad ............. H01L 31/048 |
| | | | | 136/244 |
| 5,942,048 | A | | 8/1999 | Fujisaki |
| 6,133,522 | A | | 10/2000 | Kataoka |
| 6,307,144 | B1 | * | 10/2001 | Mimura ................. H01L 31/05 |
| | | | | 136/244 |
| 6,311,436 | B1 | | 11/2001 | Mimura |
| 6,365,824 | B1 | | 4/2002 | Nakazima |
| 6,472,594 | B1 | | 10/2002 | Ichinose |
| 6,515,216 | B2 | * | 2/2003 | Zenko .................... H01L 31/02 |
| | | | | 136/244 |
| 6,586,271 | B2 | * | 7/2003 | Hanoka ............. B32B 17/10302 |
| | | | | 136/244 |
| 6,620,645 | B2 | * | 9/2003 | Chandra ................... C23C 4/00 |
| | | | | 136/244 |
| 6,670,541 | B2 | * | 12/2003 | Nagao ............... H01L 31/02008 |
| | | | | 136/251 |
| 6,960,716 | B2 | | 11/2005 | Matsumi |
| 7,259,321 | B2 | | 8/2007 | Oswald |
| 7,276,724 | B2 | | 10/2007 | Sheats |
| 7,506,477 | B2 | * | 3/2009 | Flaherty ..................... E04D 1/08 |
| | | | | 136/244 |
| 7,534,956 | B2 | * | 5/2009 | Kataoka ............... H01L 31/048 |
| | | | | 136/243 |
| 7,772,484 | B2 | | 8/2010 | Li |
| 7,833,808 | B2 | | 11/2010 | Xu |
| 7,851,700 | B2 | | 12/2010 | Luch |
| 7,858,874 | B2 | | 12/2010 | Ruskin |
| 7,902,451 | B2 | | 3/2011 | Shimizu |
| 7,964,440 | B2 | | 6/2011 | Salleo |
| 8,109,048 | B2 | * | 2/2012 | West .................... F24S 25/67 |
| | | | | 52/173.3 |
| 8,205,400 | B2 | | 6/2012 | Allen |
| 8,206,664 | B2 | | 6/2012 | Lin |
| 8,276,329 | B2 | | 10/2012 | Lenox |
| 8,307,606 | B1 | * | 11/2012 | Rego ..................... H01L 31/05 |
| | | | | 52/747.1 |
| 8,471,141 | B2 | | 6/2013 | Stancel |
| 8,519,531 | B2 | * | 8/2013 | Pilat ................... B32B 17/10018 |
| | | | | 257/433 |
| 8,664,030 | B2 | | 3/2014 | Luch |
| 8,674,377 | B2 | | 3/2014 | Farquhar |
| 8,701,360 | B2 | | 4/2014 | Ressler |
| 8,713,861 | B2 | | 5/2014 | Desloover |
| 8,822,810 | B2 | | 9/2014 | Luch |
| 8,919,075 | B2 | * | 12/2014 | Erickson ................ H02S 40/10 |
| | | | | 52/745.2 |
| 9,012,763 | B2 | * | 4/2015 | Frolov ................ H01L 31/0392 |
| | | | | 136/244 |
| 9,038,330 | B2 | | 5/2015 | Bellavia |
| 9,150,966 | B2 | | 10/2015 | Xu |
| 9,206,520 | B2 | | 12/2015 | Barr |
| 9,343,592 | B2 | | 5/2016 | Hunt |
| 9,356,173 | B2 | * | 5/2016 | Okandan ................. H02J 3/383 |
| 9,362,527 | B2 | | 6/2016 | Takemura |
| 9,412,884 | B2 | * | 8/2016 | Heng ................. H01L 31/0504 |
| 9,412,890 | B1 | * | 8/2016 | Meyers ............. H01L 31/0465 |
| 9,496,423 | B2 | * | 11/2016 | Loeckenhoff ........... H01L 31/05 |
| 9,496,819 | B2 | * | 11/2016 | Hsueh .................... H02S 20/23 |
| 9,518,391 | B2 | * | 12/2016 | Haynes ................... E04D 13/00 |
| 9,525,092 | B2 | | 12/2016 | Mayer |
| 9,825,582 | B2 | | 11/2017 | Fernandes |
| 9,882,077 | B2 | * | 1/2018 | Morad .................... H01L 31/05 |
| 9,899,554 | B2 | | 2/2018 | Yang |
| 9,954,480 | B2 | * | 4/2018 | Haynes ................ H01L 31/048 |
| 9,966,487 | B2 | | 5/2018 | Magnusdottir |
| 10,056,522 | B2 | * | 8/2018 | Gonzalez ........... H01L 31/1876 |
| 10,145,116 | B2 | * | 12/2018 | Holt ....................... H02S 20/23 |
| 10,177,708 | B2 | * | 1/2019 | Cruz ....................... H02S 30/10 |
| 10,256,765 | B2 | * | 4/2019 | Rodrigues ............... F24S 25/67 |
| 10,461,685 | B2 | * | 10/2019 | Anderson ............... H02S 40/36 |
| 10,563,406 | B2 | * | 2/2020 | Kalkanoglu ........ H01L 31/0201 |
| | | | | 136/244 |
| 2001/0054435 | A1 | | 12/2001 | Nagao |
| 2002/0015782 | A1 | | 2/2002 | Abys |
| 2003/0180983 | A1 | | 9/2003 | Oswald |
| 2004/0261840 | A1 | | 12/2004 | Schmit |
| 2005/0039788 | A1 | | 2/2005 | Blieske |
| 2005/0268963 | A1 | | 12/2005 | Jordan |
| 2006/0048798 | A1 | | 3/2006 | McCoy |
| 2006/0086620 | A1 | | 4/2006 | Chase |
| 2006/0204730 | A1 | | 9/2006 | Nakamura |
| 2008/0053511 | A1 | * | 3/2008 | Nakamura .......... H01L 31/0201 |
| | | | | 136/244 |
| 2008/0135085 | A1 | | 6/2008 | Corrales |
| 2009/0101192 | A1 | | 4/2009 | Kothari |
| 2009/0120497 | A1 | | 5/2009 | Schetty |
| 2009/0133739 | A1 | | 5/2009 | Shiao |
| 2009/0133740 | A1 | | 5/2009 | Shiao |
| 2009/0233083 | A1 | | 9/2009 | Inoue |
| 2009/0242021 | A1 | | 10/2009 | Petkie |
| 2009/0287446 | A1 | | 11/2009 | Wang |
| 2009/0308435 | A1 | | 12/2009 | Caiger |
| 2010/0000603 | A1 | | 1/2010 | Tsuzuki |
| 2010/0006147 | A1 | | 1/2010 | Nakashima |
| 2010/0018568 | A1 | | 1/2010 | Nakata |
| 2010/0132762 | A1 | | 6/2010 | Graham |
| 2010/0147363 | A1 | | 6/2010 | Huang |
| 2010/0147364 | A1 | * | 6/2010 | Gonzalez ........... H01L 31/02021 |
| | | | | 136/251 |
| 2010/0180929 | A1 | | 7/2010 | Raymond |
| 2011/0023937 | A1 | | 2/2011 | Daniel |
| 2011/0023942 | A1 | | 2/2011 | Soegding |
| 2011/0030761 | A1 | | 2/2011 | Kalkanoglu |
| 2011/0277825 | A1 | | 11/2011 | Fu |
| 2012/0000502 | A1 | * | 1/2012 | Wiedeman ............ H01L 31/048 |
| | | | | 136/244 |
| 2012/0012162 | A1 | | 1/2012 | Kobayashi |
| 2012/0031470 | A1 | | 2/2012 | Dimov |
| 2012/0048349 | A1 | | 3/2012 | Metin |
| 2012/0060911 | A1 | | 3/2012 | Fu |
| 2012/0125391 | A1 | | 5/2012 | Pinarbasi |
| 2012/0199184 | A1 | | 8/2012 | Nie |
| 2012/0237670 | A1 | | 9/2012 | Lim |
| 2013/0048062 | A1 | | 2/2013 | Min |
| 2013/0061913 | A1 | | 3/2013 | Willham |
| 2013/0160823 | A1 | | 6/2013 | Khouri |
| 2013/0206213 | A1 | | 8/2013 | He |
| 2013/0209776 | A1 | | 8/2013 | Kim |

(56) References Cited

U.S. PATENT DOCUMENTS

| | | | |
|---|---|---|---|
| 2013/0233378 A1 | 9/2013 | Moslehi | |
| 2013/0247959 A1 | 9/2013 | Kwon | |
| 2013/0255755 A1 | 10/2013 | Chich | |
| 2013/0280521 A1 | 10/2013 | Mori | |
| 2014/0120699 A1 | 5/2014 | Hua | |
| 2014/0124014 A1* | 5/2014 | Morad | H01L 31/042 136/246 |
| 2014/0196768 A1 | 7/2014 | Heng et al. | |
| 2014/0313574 A1 | 10/2014 | Bills | |
| 2014/0360582 A1 | 12/2014 | Cui | |
| 2015/0090314 A1 | 4/2015 | Yang | |
| 2015/0155824 A1 | 6/2015 | Chien | |
| 2015/0194552 A1 | 7/2015 | Ogasahara | |
| 2015/0243931 A1 | 8/2015 | Fukuura | |
| 2015/0270410 A1 | 9/2015 | Heng | |
| 2015/0349145 A1 | 12/2015 | Morad | |
| 2015/0349152 A1 | 12/2015 | Voss | |
| 2015/0349703 A1 | 12/2015 | Morad | |
| 2016/0013329 A1 | 1/2016 | Brophy | |
| 2016/0105144 A1 | 4/2016 | Haynes | |
| 2016/0163902 A1 | 6/2016 | Podlowski | |
| 2016/0181446 A1 | 6/2016 | Kalkanoglu | |
| 2016/0225931 A1 | 8/2016 | Heng | |
| 2017/0033250 A1 | 2/2017 | Ballif | |
| 2017/0077343 A1 | 3/2017 | Morad | |
| 2017/0194516 A1 | 7/2017 | Reddy | |
| 2017/0222082 A1 | 8/2017 | Lin | |
| 2018/0166601 A1 | 6/2018 | Inaba | |

FOREIGN PATENT DOCUMENTS

| | | |
|---|---|---|
| CN | 102956730 | 6/2016 |
| DE | 102007054124 | 5/2009 |
| EP | 1058320 | 12/2000 |
| EP | 2051124 A2 | 4/2009 |
| EP | 2709160 | 3/2014 |
| GB | 2278618 | 12/1994 |
| JP | S57141979 | 9/1982 |
| JP | S6020586 | 2/1985 |
| JP | H06140657 | 5/1994 |
| JP | H06264571 | 9/1994 |
| JP | 2000091610 | 3/2000 |
| JP | 2000216415 | 8/2000 |
| JP | 2013211385 | 10/2013 |
| WO | 2008136872 | 11/2008 |
| WO | 2009062106 | 5/2009 |
| WO | 2009099418 | 8/2009 |
| WO | 2010128375 | 11/2010 |
| WO | 2011128757 | 10/2011 |
| WO | 201359441 | 4/2013 |
| WO | 2013067541 | 5/2013 |
| WO | 2013102181 | 7/2013 |
| WO | 2014178180 | 11/2014 |
| WO | 2015155356 | 10/2015 |
| WO | 2016090341 | 6/2016 |

OTHER PUBLICATIONS

Bulucani et al., "A new approach: low cost masking material and efficient copper metallization for higher efficiency silicon solar cells" 2015 IEEE.

Fan et al., "Laser micro machined wax-covered plastic paper as both sputter deposition shadow masks and deep-ultraviolet patterning masks for polymethylmacrylate-based microfluidic systems" via google scholar, downloaded Mar. 31, 2016.

"An inorganic/organic hybrid coating for low cost metal mounted dye-sensitized solar cells" Vyas, N. et al.

"Recovery Act: Organic Coatings as Encapsulants for Low Cost, High Performance PV Modules" Jim Poole et al. Nov. 16, 2011.

\* cited by examiner

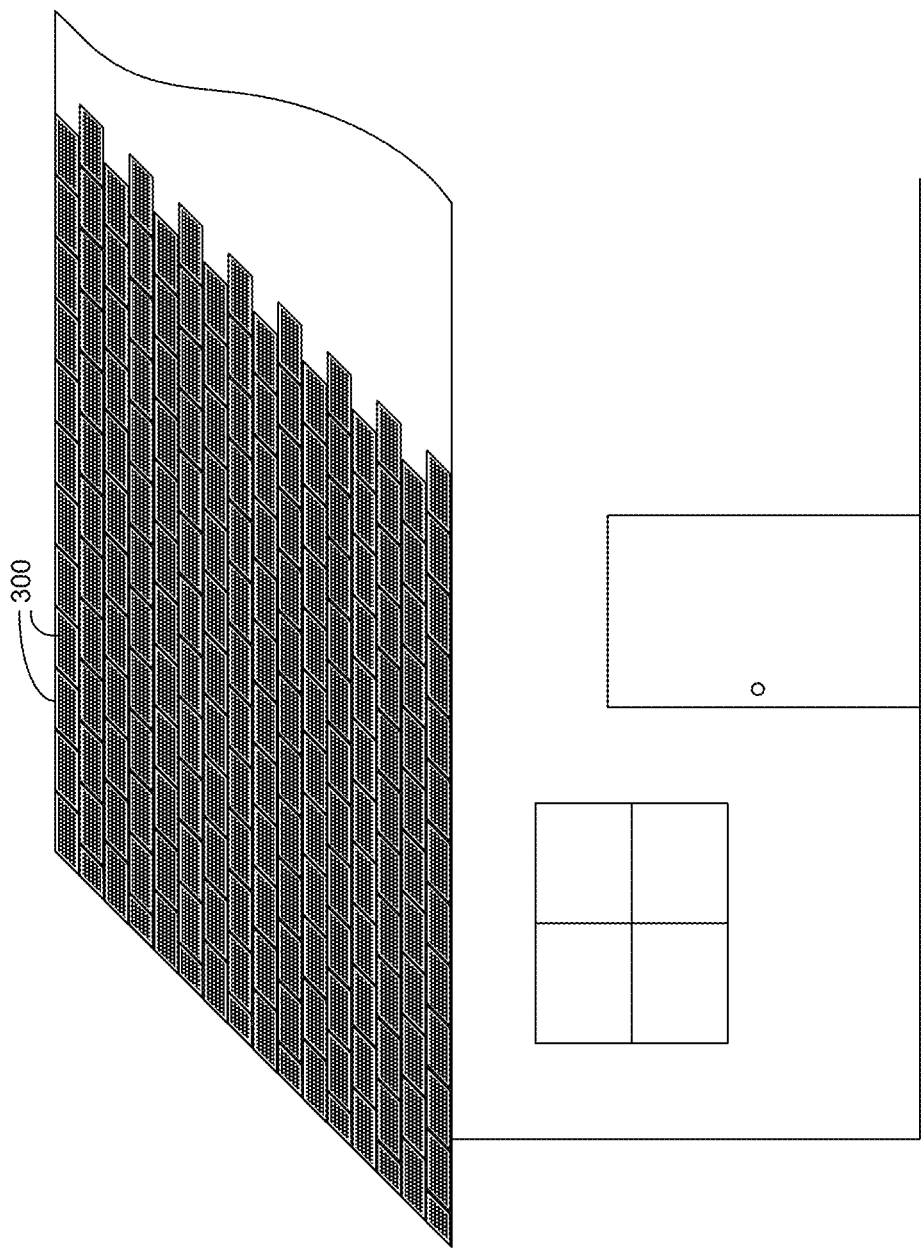

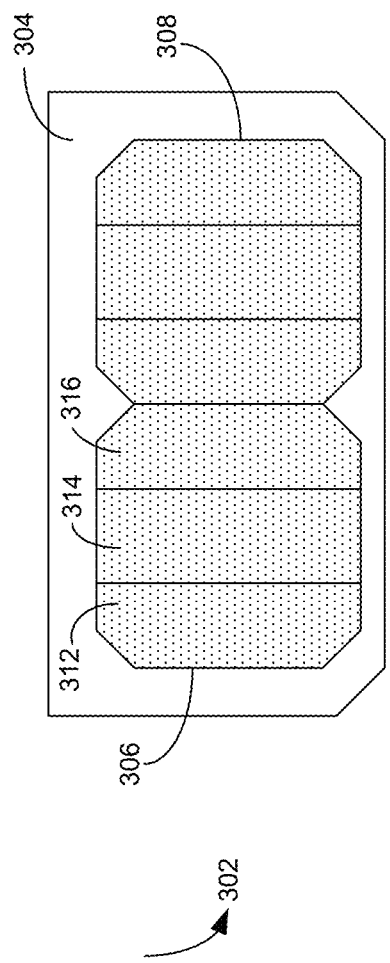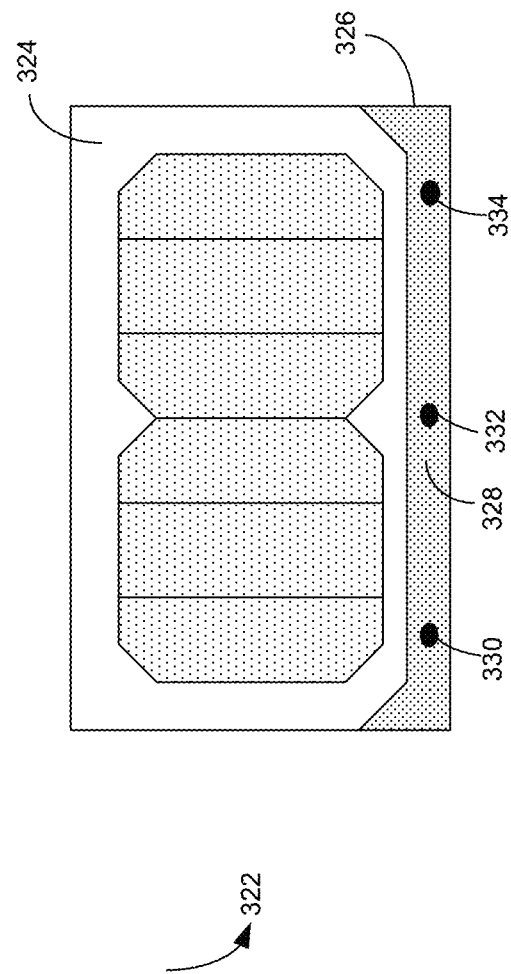

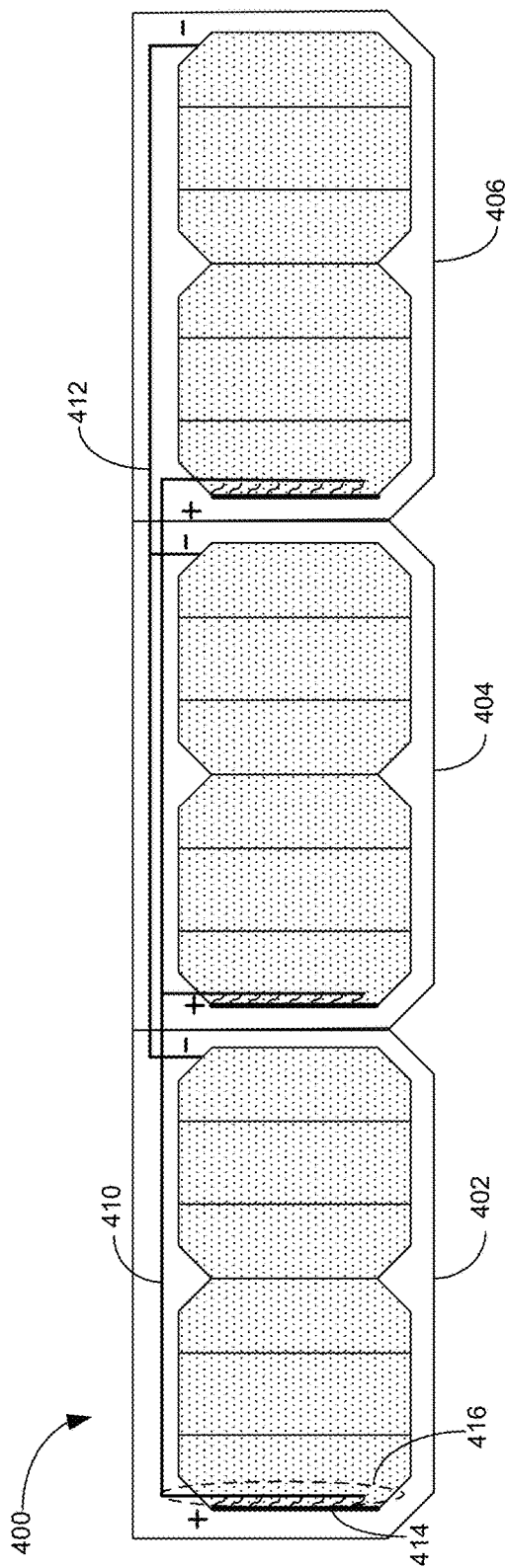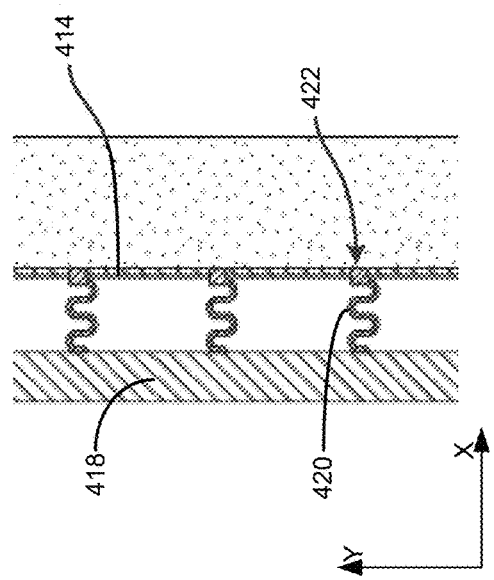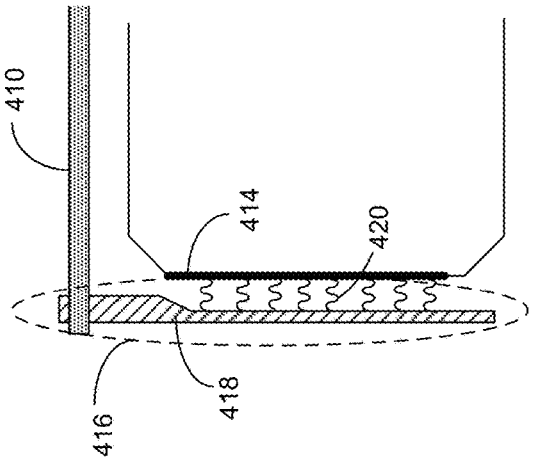
FIG. 4A
FIG. 4B
FIG. 4C

A-A'

PACKAGING FOR SOLAR ROOF TILES

FIELD OF THE INVENTION

This is generally related to solar modules. More specifically, this is related to solar roof tile modules.

Definitions

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A photovoltaic structure may be divided into a number of strips. A strip may have any shape and any size. The width and length of a strip may be the same as or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a "string."

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

A "solar roof tile" refers to a solar module that not only is capable of generating electricity by absorbing sunlight but can also function as a conventional roof tile.

BACKGROUND

Advances in photovoltaic technology, which is used to make solar panels, have helped solar energy gain mass appeal among those wishing to reduce their carbon footprint and decrease their monthly energy costs. In the past decade, the number of residential homes equipped with solar panels has grown significantly. However, conventional rooftop solar panels often leave some portion of the roof uncovered, thus missing the opportunity to collect as much solar energy as possible. In addition, these conventional rooftop panels can be industrial-looking and often lack the curb appeal many homeowners desire.

Solar shingles or tiles, on the other hand, are solar modules that have similar appearances as conventional roof shingles or tiles. In addition to converting sunlight into electricity, the solar shingles or tiles also protect the roof from weather the same way traditional shingles or tiles do. They allow homeowners to turn their roof into an electricity generator while maintaining a conventional roofline.

Packaging high-efficiency photovoltaic structures into a roof shingle or tile that can withstand different and sometimes extreme weather conditions is not simple. Moreover, the electrical interconnections among individual solar shingles or tiles also need to be weatherproof. Furthermore, the solar shingles or tiles also need to allow for easy installation.

SUMMARY

One embodiment can provide a solar roof tile module. The solar roof tile module can include a plurality of solar roof tiles positioned side by side and one or more tile spacers. The solar roof tiles can be electrically and mechanically coupled to each other. A respective tile spacer can be positioned between two adjacent solar roof tiles, thereby preventing water leakage through the solar roof tile module. A respective solar roof tile can include a front cover, a back cover, and a plurality of photovoltaic strips positioned between the front cover and the back cover. Each photovoltaic strip can include a first edge busbar located on an edge of a first surface and a second edge busbar located on an opposite edge of a second surface, and the photovoltaic strips can be arranged in such a way that the first edge busbar of a photovoltaic strip overlaps with a second edge busbar of an adjacent photovoltaic strip, thereby forming a serial connection among the photovoltaic strips.

In a variation of the embodiment, the spacer can be further configured to mechanically couple the two adjacent solar roof tiles.

In a variation of the embodiment, the front cover can be made of tempered glass.

In a variation of the embodiment, the solar roof tile module can include a pair of junction boxes for facilitating electrical coupling between the solar roof tile module and an adjacent solar roof tile module, and a junction box can be mounted on the back cover of a particular solar roof tile.

In a further variation, the junction box can include an attachment pad and a lead wire electrically coupled to the attachment pad. The attachment pad can be configured to electrically access photovoltaic strips encapsulated inside the particular solar roof tile via a through hole on the back cover of the particular solar roof tile, and at least a portion of the lead wire can be protected by a weatherproof jacket.

In a variation of the embodiment, the adjacent solar roof tiles can be electrically coupled to each other via one or more metal tabs.

In a further variation, the spacer can include a recessed space configured to provide a passageway for the metal tabs.

In a further variation, the solar roof tile can further include a strain-relief connector configured to electrically couple an exposed edge busbar of the photovoltaic strips to one of the metal tabs.

In a further variation, the strain-relief connector can include a plurality of curved metal wires electrically coupled to the exposed edge busbar.

In a variation of the embodiment, the plurality of solar roof tiles can be electrically coupled to each other in parallel.

In a variation of the embodiment, a respective photovoltaic strip can be obtained by dividing a substantially square-shaped photovoltaic structure into n equal pieces, and the solar roof tile module can include n solar roof tiles.

In a variation of the embodiment, the back cover of the solar roof tile can include a back sheet that extends beyond a boundary of the front cover, and an extended portion of the back cover can form a nail strip to facilitate mechanical coupling between the solar roof tile and a roof batten.

BRIEF DESCRIPTION OF THE FIGURES

FIG. 3A shows an exemplary configuration of solar roof tiles on a house, according to an embodiment of the present invention.

FIG. 3B shows an exemplary solar roof tile, according to one embodiment.

FIG. 3C shows an exemplary solar roof tile, according to one embodiment.

FIG. 4A shows the top view of an exemplary solar roof tile module, according to one embodiment.

FIG. 4B shows the coupling between the busbar and the metal tab via strain-relief connectors, according to one embodiment.

FIG. 4C shows the amplified view of the curved wires, according to one embodiment.

In the figures, like reference numerals refer to the same figure elements.

DETAILED DESCRIPTION

Figure 1A:
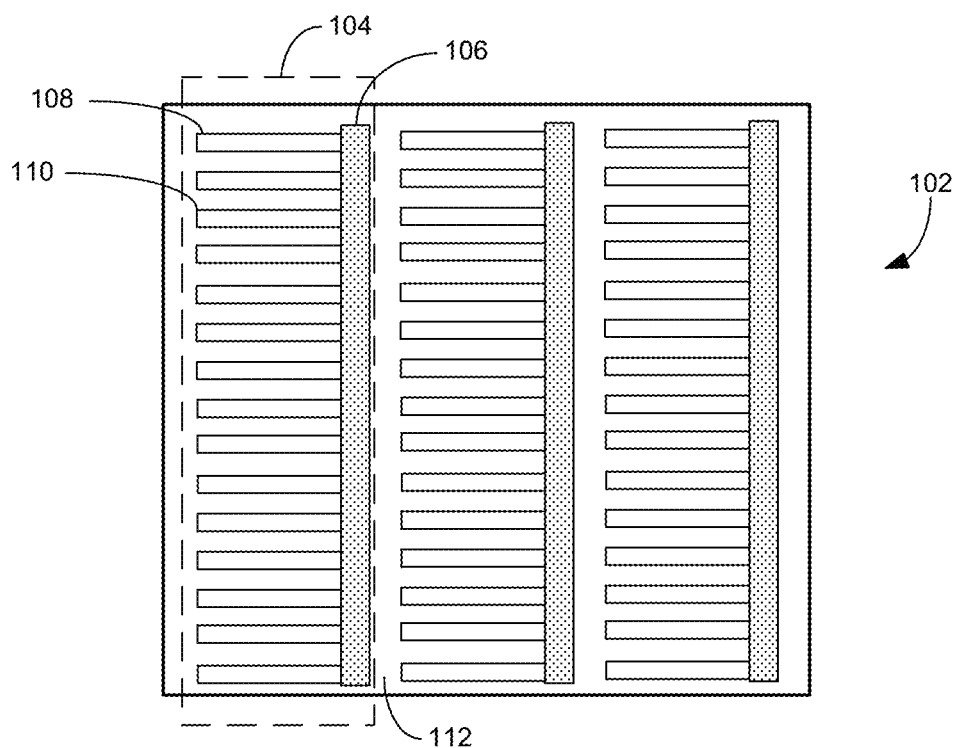
FIG. 1A shows an exemplary conductive grid pattern on the front surface of a photovoltaic structure.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Overview

Embodiments of the invention provide a solution for the technical problem of packaging photovoltaic structures in order to form a solar roof tile module. Cascaded photovoltaic strips can be sandwiched between two covers made of tempered glass to form a tile. Multiple (e.g., three) tiles can be electrically and mechanically coupled to each other in order to form a tile module. Parallel electrical coupling among multiple solar roof tiles can reduce the internal resistance. A pair of junction boxes can be attached to the back side of each tile module to enable interconnections among multiple tile modules.

Solar Roof Tile with Cascaded Strips

As described in U.S. patent application Ser. No. 14/563,867, parallel connecting multiple (such as 3) strings of cascaded solar strips can provide a solar module with a reduced internal resistance. In general, a cell can be divided into a number of (e.g., n) strips, and a module can contain a number of parallel strings of cascaded strips (the number of strings can be the same as or different from the number of strips in the cell). If a string has the same number of strips as the number of undivided photovoltaic structures in a conventional single-string module, the string can output approximately the same voltage as the conventional module. Multiple strings can be connected in parallel to form a module. If the number of strings in the module is the same as the number of strips in the cell, the module can output roughly the same current as the conventional module. On the other hand, the module's total internal resistance can be a fraction (e.g., 1/n) of the resistance of a string. Therefore, in general, the greater n is, the lower the total internal resistance of the module, and the more power one can extract from the module. However, a tradeoff is that as n increases, the number of connections required to interconnect the strings also increases, which increases the amount of contact resistance. Also, the greater n is, the more strips a single cell needs to be divided into, which increases the associated production cost and decreases overall reliability due to the larger number of strips used in a single panel.

Another consideration in determining n is the contact resistance between the electrode and the photovoltaic structure on which the electrode is formed. The greater this contact resistance, the greater n might need to be to reduce effectively the panel's overall internal resistance. Hence, for a particular type of electrode, different values of n might be needed to attain sufficient benefit in reduced total panel internal resistance to offset the increased production cost and reduced reliability. For example, a conventional electrode based on silver-paste or aluminum may require n to be greater than 4, because the process of screen printing and firing silver paste onto a cell does not produce an ideal resistance between the electrode and the underlying photovoltaic structure. In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed, silver-paste electrode. Consequently, a smaller n can be used to attain the benefit of reduced panel internal resistance. In some embodiments, n is selected to be three, which is less than the n value generally needed for cells with silver-paste electrodes or other types of electrodes. Correspondingly, two grooves can be scribed on a single cell to allow the cell to be divided into three strips.

In addition to lower contact resistance, electroplated copper electrodes can also offer better tolerance to microcracks, which may occur during a cleaving process. Such microcracks might adversely affect cells with silver-paste electrodes. Plated-copper electrodes, on the other hand, can preserve the conductivity across the cell surface even if there are microcracks in the photovoltaic structure. The copper electrode's higher tolerance for microcracks allows one to use thinner silicon wafers to manufacture cells. As a result, the grooves to be scribed on a cell can be shallower than the grooves scribed on a thicker wafer, which in turn helps increase the throughput of the scribing process. More details on using copper plating to form a low-resistance electrode on a photovoltaic structure are provided in U.S. patent application Ser. No. 13/220,532, entitled "SOLAR CELL WITH ELECTROPLATED GRID," filed Aug. 29, 2011, the disclosure of which is incorporated herein by reference in its entirety.

FIG. 1A shows an exemplary grid pattern on the front surface of a photovoltaic structure, according to one embodiment of the present invention. In the example shown in FIG. 1A, grid 102 includes three sub-grids, such as sub-grid 104. This three sub-grid configuration allows the photovoltaic structure to be divided into three strips. To enable cascading, each sub-grid needs to have an edge busbar, which can be located either at or near the edge. In the example shown in FIG. 1A, each sub-grid includes an edge busbar ("edge" here refers to the edge of a respective strip) running along the longer edge of the corresponding strip and a plurality of parallel finger lines running in a direction parallel to the shorter edge of the strip. For example, sub-grid 104 can include edge busbar 106, and a plurality of finger lines, such as finger lines 108 and 110. To facilitate the subsequent laser-assisted scribe-and-cleave process, a predefined blank space (i.e., space not covered by electrodes) is inserted between the adjacent sub-grids. For example, blank space 112 is defined to separate sub-grid 104 from its adjacent sub-grid. In some embodiments, the width of the blank space, such as blank space 112, can be between 0.1 mm and 5 mm, preferably between 0.5 mm and 2 mm. There is a tradeoff between a wider space that leads to a more tolerant scribing operation and a narrower space that leads to more effective current collection. In a further embodiment, the width of such a blank space can be approximately 1 mm.

Figure 1B:
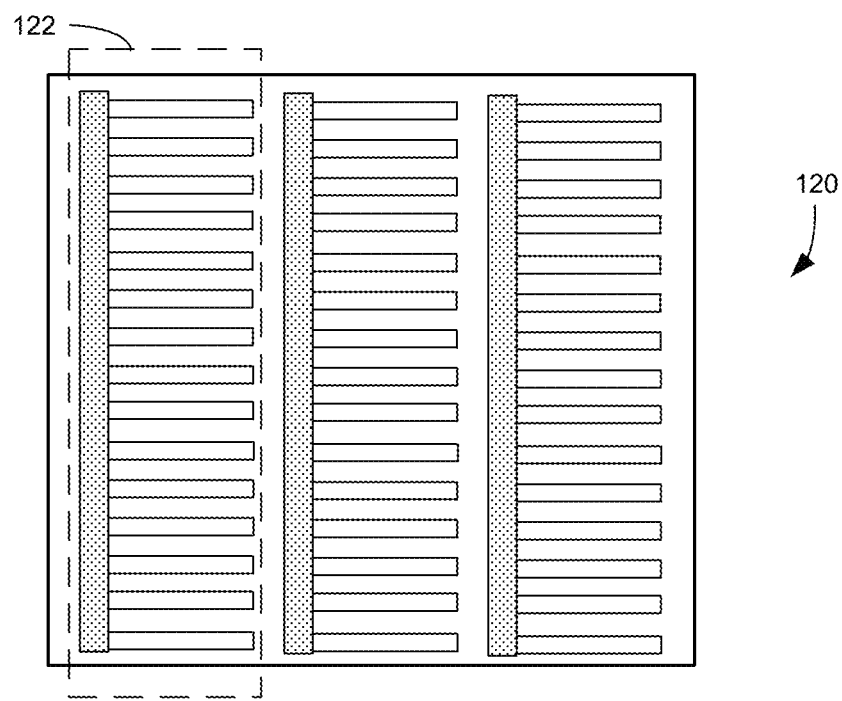
FIG. 1B shows an exemplary conductive grid pattern on the back surface of a photovoltaic structure.

FIG. 1B shows an exemplary grid pattern on the back surface of a photovoltaic structure, according to one embodiment of the invention. In the example shown in FIG. 1B, back grid 120 can include three sub-grids, such as sub-grid 122. To enable cascaded and bifacial operation, the back sub-grid may correspond to the front sub-grid. More specifically, the back edge busbar needs to be located near the opposite edge of the frontside edge busbar. In the examples shown in FIGS. 1A and 1B, the front and back sub-grids have similar patterns except that the front and back edge busbars are located adjacent to opposite edges of the strip. In addition, locations of the blank spaces in back conductive grid 120 correspond to locations of the blank spaces in front conductive grid 102, such that the grid lines do not interfere with the subsequent scribe-and-cleave process. In practice, the finger line patterns on the front and back side of the photovoltaic structure may be the same or different.

In the examples shown in FIGS. 1A and 1B, the finger line patterns can include continuous, non-broken loops. For example, as shown in FIG. 1A, finger lines 108 and 110 both include connected loops with rounded corners. This type of "looped" finger line pattern can reduce the likelihood of the finger lines peeling away from the photovoltaic structure after a long period of usage. Optionally, the sections where parallel lines are joined can be wider than the rest of the finger lines to provide more durability and prevent peeling. Patterns other than the one shown in FIGS. 1A and 1B, such as un-looped straight lines or loops with different shapes, are also possible.

Figure 2A:
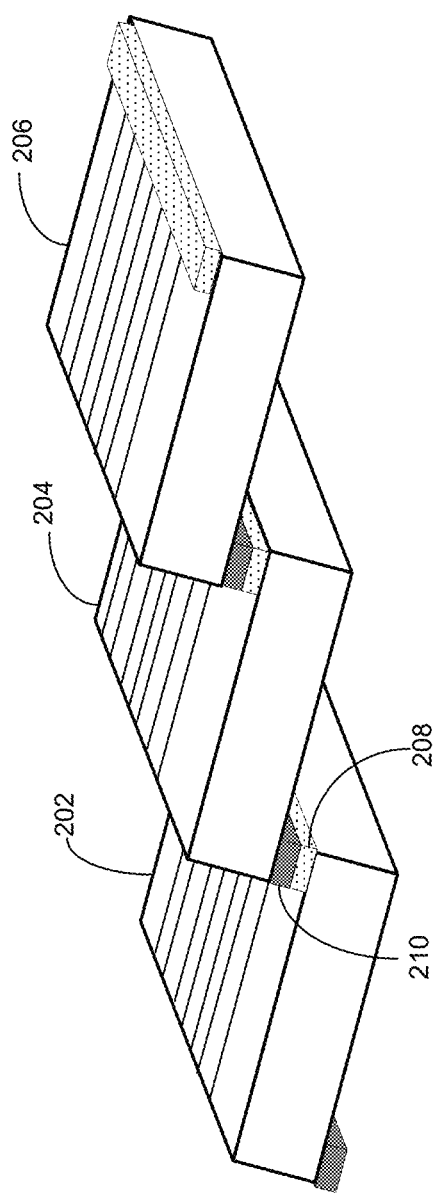
FIG. 2A shows a string of strips stacked in a cascaded pattern.

To form a cascaded string, cells or strips (e.g., as a result of a scribing-and-cleaving process applied to a regular square cell) can be cascaded with their edges overlapped. FIG. 2A shows a string of cascaded strips, according to an embodiment of the invention. In FIG. 2A, strips 202, 204, and 206 are stacked in such a way that strip 206 partially overlaps adjacent strip 204, which also partially overlaps (on an opposite edge) strip 202. Such a string of strips forms a pattern that is similar to roof shingles. Each strip includes top and bottom edge busbars located at opposite edges of the top and bottom surfaces, respectively. Strips 202 and 204 are coupled to each other via an edge busbar 208 located at the top surface of strip 202 and an edge busbar 210 located at the bottom surface of strip 204. To establish electrical coupling, strips 202 and 204 are placed in such a way that bottom edge busbar 210 is placed on top of and in direct contact with top edge busbar 208.

Figure 2B:
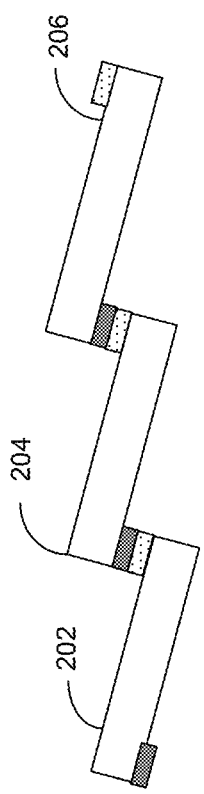
FIG. 2B shows the side view of the string of cascaded strips.

FIG. 2B shows a side view of the string of cascaded strips, according to one embodiment of the invention. In the example shown in FIGS. 2A and 2B, the strips can be part of a six-inch square or pseudo-square photovoltaic structure, with each strip having a dimension of approximately two inches by six inches. To reduce shading, the overlapping between adjacent strips should be kept as small as possible. In some embodiments, the single busbars (both at the top and the bottom surfaces) are placed at the very edge of the strip (as shown in FIGS. 2A and 2B). The same cascaded pattern can extend along an entire row of strips to form a serially connected string.

FIG. 3A shows an exemplary configuration of solar roof tiles on a house, according to an embodiment of the present invention. In this example, solar roof tiles 300 can be installed on a house like conventional roof tiles or shingles, and can provide the functions of conventional roof tiles as well as solar cells. Particularly, a solar roof tile can be placed along with other tiles in such a way as to prevent water leakage. At the same time, electrical connections can be made between two adjacent tiles to interconnect multiple tiles into a module, so that a number of solar roof tiles can jointly provide electrical power.

Considering that a conventional roof tile can have a dimension of a few inches by few inches (e.g., seven inches by ten inches), a solar roof tile can have a similar dimension in order to imitate the conventional roof tiles. For example, a solar roof tile can include two six-inch solar cells arranged side by side. To reduce the internal resistance, each six-inch solar cell can be divided into three strips, and the six strips can be cascaded one by one to form a serially connected string, which is then encapsulated between two covers. The top, sun-facing cover can be made of glass and the bottom cover can be made of glass or non-transparent materials, such as polyethylene terephthalate (PET), fluoropolymer, polyvinyl fluoride (PVF), polytetrafluoroethylene (PTGE), and polyamide. In some embodiments, the bottom cover may also include a metal (e.g., Al) layer embedded between layers of insulation materials for moisture-resistance purposes.

FIG. 3B shows an exemplary solar roof tile, according to one embodiment. A solar roof tile 302 includes top glass cover 304 and solar cells 306 and 308. The bottom cover of solar roof tile 302 is out of view in FIG. 3B. Solar cells 306 and 308 can be conventional square or pseudo-square solar cells, such as six-inch solar cells. In some embodiments, solar cells 306 and 308 can each be divided into three separate pieces of similar sizes. For example, solar cell 306 can include strips 312, 314, and 316. These strips can be arranged in such a way that adjacent strips are partially overlapped at the edges, similar to the ones shown in FIGS. 2A-2B. For simplicity of illustration, the electrode grids, including the finger lines and edge busbars, of the strips are not shown in FIG. 3B.

In the example shown in FIG. 3B, the bottom cover of the solar roof tile can be similar in size as the top cover. In practice, it is also possible for the bottom cover to have a different size than the top cover, as long as the encapsulation was appropriately applied to protect the photovoltaic strips between the two covers. In some embodiments, the bottom cover can include a non-glass back-sheet that is slightly larger than the front cover. For example, the back sheet can be slightly longer than the front cover, forming a ledge extending beyond the edge of the front cover. This extended ledge can be part of the coupling mechanism that couples the solar roof tile to a batten of the roof. For example, nails or bolts can be used to nail or bolt down the solar roof tile onto the roof batten.

FIG. 3C shows an exemplary solar roof tile, according to one embodiment. Solar roof tile 322 can include front cover 324 and back cover 326. Back cover 326 can be slightly longer, at least in one direction, than front cover 324, forming ledge 328. During installation of solar roof tile 322, a worker can apply nails (e.g., nails 330, 332, and 334) on ledge 328, attaching solar roof tile 322 to an underlying roof batten. This way, the solar roof tiles can be installed in a way that is very similar to the installation of roof shingles or tiles.

As discussed previously, the output voltage of the six serially connected strips (or the tile) can be approximately $6 \times V_{oc}$, and the output current of the tile can be approximately $J_{sc}/3$, with $V_{oc}$, and $J_{sc}$ being the open-circuit voltage and short-circuit current of the original square solar cell, respectively. In some embodiments, three tiles can be placed side by side and electrically coupled in parallel to form a tile group or a tile module. The output voltage and current of the tile group or module can be approximately $6 \times V_{oc}$, and $J_{sc}$, respectively. In other words, the output voltage and current of the tile module can be similar to those of a module having six undivided, square solar cells coupled in series. During installation, individual tile modules can be laid down one at a time the way conventional roof tiles are laid.

FIG. 4A shows the top view of an exemplary solar roof tile module, according to one embodiment. Solar module 400 can include solar roof tiles 402, 404, and 406 arranged side by side. Solar roof tiles 402, 404, and 406 can be similar to solar roof tile 302 shown in FIG. 3B or solar roof tile 322 shown in FIG. 3C. Each solar roof tile can include six cascaded strips encapsulated between the front and back covers, meaning that busbars located at opposite edges of the cascaded string of strips have opposite polarities. For example, if the leftmost edge busbar of the strips in solar roof tile 402 has a positive polarity, then the rightmost edge busbar of the strips will have a negative polarity. Parallel connections can be established among the tiles by electrically coupling busbars having the same polarity.

In the example shown in FIG. 4A, the solar roof tiles are arranged in such a way that their sun-facing sides have the same electrical polarity. As a result, the edge busbars of the same polarity will be on the same left or right edge. For example, the leftmost edge busbar of all solar roof tiles can have a positive polarity and the rightmost edge busbar of all solar roof tiles can have a negative polarity, or vice versa. In FIG. 4A, the left edge busbars of all strips have a positive polarity (indicated by the "+" signs) and are located on the sun-facing (or front) surface of the strips, whereas the right edge busbars of all strips have a negative polarity (indicated by the "−" signs) and are located on the back surface. Depending on the design of the layer structure of the solar cell, the polarity and location of the edge busbars can be different from those shown in FIG. 4A.

A parallel connection among the tiles can be formed by electrically coupling all leftmost busbars together via metal tab 410 and all rightmost busbars together via metal tab 412. Metal tabs 410 and 412 are also known as connection buses and typically can be used for interconnecting individual solar cells or strings. A metal tab can be stamped, cut, or otherwise formed from conductive material, such as copper. Copper is a highly conductive and relatively low cost connector material. However, other conductive materials such as silver, gold, or aluminum can be used. In particular, silver or gold can be used as a coating material to prevent oxidation of copper or aluminum. In some embodiments, alloys that have been heat treated to have super-elastic properties can be used for all or part of the metal tab. Suitable alloys may include, for example, copper-zinc-aluminum (CuZnAl), copper-aluminum-nickel (CuAlNi), or copper-aluminum-beryllium (CuAlBe). In addition, the material of the metal tabs disclosed herein can be manipulated in whole or in part to alter mechanical properties. For example, all or part of metal tabs 410 and 412 can be forged (e.g., to increase strength), annealed (e.g., to increase ductility), and/or tempered (e.g. to increase surface hardness).

The coupling between a metal tab and a busbar can be facilitated by a specially designed strain-relief connector. In FIG. 4A, strain-relief connector 416 can be used to couple busbar 414 and metal tab 410. Such strain-relief connectors are needed due to the mismatch of the thermal expansion coefficients between metal (e.g., Cu) and silicon. More particularly, metal tends to expand or contract more than Si-based photovoltaic strips when the solar roof tile is heated or cooled, thus initiating shear forces at bonded joints between the metal tabs and the photovoltaic strips. Specially designed strain-relief connectors can help alleviate destructive thermal expansion and contraction effects in the solar roof tiles.

As shown in FIG. 4A, the metal tabs (e.g., tabs 410 and 412) may cross paths with strain-relief connectors of opposite polarities. To prevent an electrical short of the photovoltaic strips, portions of the metal tabs and/or strain-relief connectors can be coated with an insulation film or wrapped with a sheet of insulation material.

FIG. 4B shows the coupling between the busbar and the metal tab via strain-relief connectors, according to one embodiment. Strain-relief connector 416 can include elongated connection member 418 and a number of curved metal wires (e.g., curved metal wire 420). Elongated connection member 418 can extend along a direction that is substantially parallel to busbar 414. In some embodiments, elongated connection member 418 can be made in a way and with materials similar to those of the metal tabs. To establish electrical coupling, elongated connection member 418 and metal tab 410 can be in direct physical contact. In some embodiments, to increase the area of contact, elongated connection member 418 can also include a widened area at one end, as shown in FIG. 4B. In the example shown in FIG. 4B, elongated connection member 418 and metal tab 410 appear as separate components. In practice, it is also possible for connection member 418 and metal tab 410 to be formed from a single piece of material, for example, by die cutting or laser cutting a foil sheet.

The curved metal wires can extend laterally from elongated connection member 418. The curved metal wires and elongated connection member 418 can also be formed from a single piece of material, for example, by die cutting or laser cutting a foil sheet. However, in some cases, one or more of the curved wires can be attached to connection member 418 by any suitable electrical connection, such as a connection formed by soldering, welding, or bonding.

FIG. 4C shows the amplified view of the curved wires, according to one embodiment. Each of the curved wires (e.g., curved wire 420) can extend from connection member 418 to busbar 414 in a non-linear manner (i.e., having non-linear geometry) in both lateral and vertical directions. Non-linear geometry can include paths that centrally follow a curved wire (e.g., a path that extends along a series of centermost points located between outermost edges) or along any face or edge of the wire. A curved wire having non-linear geometry can have, but does not require, symmetry along the path of elongation. For example, one edge, or portion of an edge, of a curved wire can be straight and an opposite edge can include one or more curves, cuts, or extensions. Curved wires having non-linear geometry can include straight portions before, after, and/or between non-linear portions. Non-linear geometry can include propagating paths that extend laterally along a first axis (e.g., X axis) while alternating direction in negative and positive directions of one or more other axes (e.g., Y axis and/or Z axis) that are perpendicular to the first axis, in a repetitive manner, such as a sine wave or helix. While the curved wires disclosed herein use curved profiles, non-linear geometry can be constructed from a series of straight lines; for example, propagating shapes, such as square or sawtooth waves, can form non-linear geometry.

FIG. 4C also shows that each of the curved wires can terminate at a solder pad on the busbar in order to form an electrical connection. For example, curved wire 420 terminates at solder pad 422 located on busbar 414. Solder pad 422 can have a rectangular shape and hold a predetermined amount of solder material for reflow soldering. In some embodiments, the solder pads can be part of the busbar design.

Figure 4D:
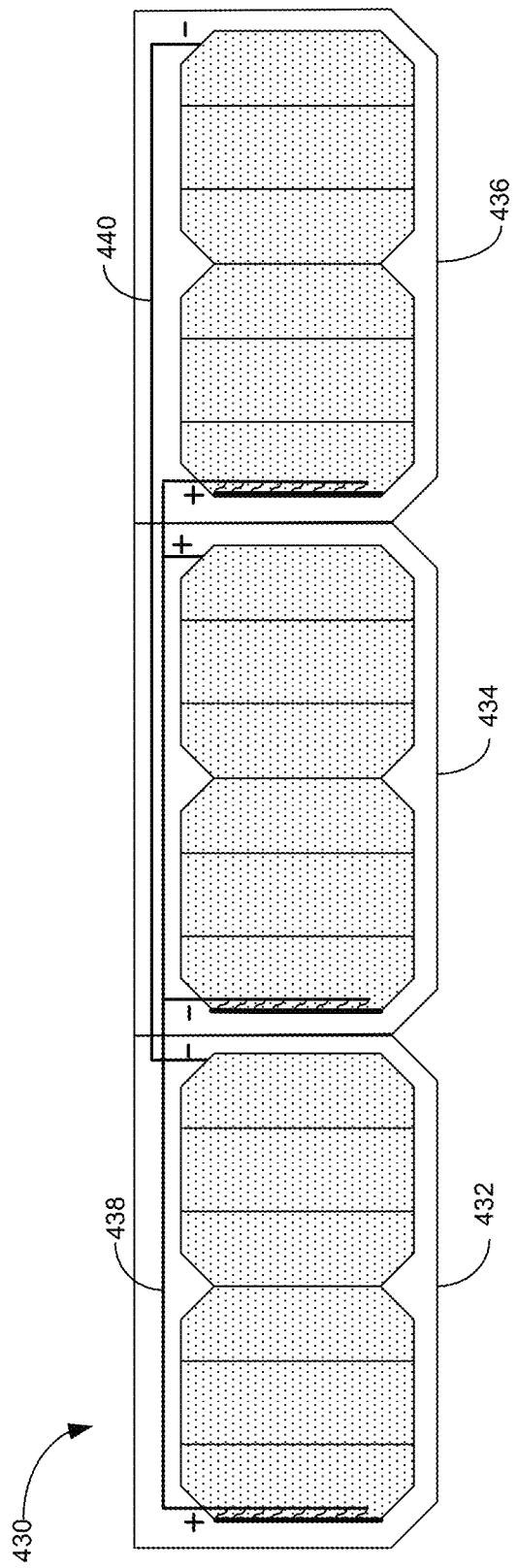
FIG. 4D shows the top view of an exemplary solar roof tile module, according to one embodiment.

Other tile configurations can also be possible. For example, the solar roof tiles can be arranged such that the sun-facing sides of the different tiles may have different electrical polarities. FIG. 4D shows the top view of an exemplary solar roof tile module, according to one embodiment. Solar module 430 can include solar roof tiles 432, 434, and 436 arranged side by side. Solar roof tiles 432 and 436 may have the same polarity arrangement, with their leftmost edge busbars having a positive polarity and rightmost edge busbars having a negative polarity. In contrast, the leftmost edge busbar of solar roof tile 434 can have a negative polarity and the rightmost edge busbar of solar roof tile 434 can have a positive polarity. Accordingly, a parallel connection can be achieved by coupling the leftmost edge busbars of solar roof tiles 432 and 436 with the rightmost edge busbar of solar roof tile 434 via metal tab 438 and by coupling the rightmost edge busbars of solar roof tiles 432 and 436 with the leftmost edge busbar of solar roof tile 434 via metal tab 440.

Figure 4E:
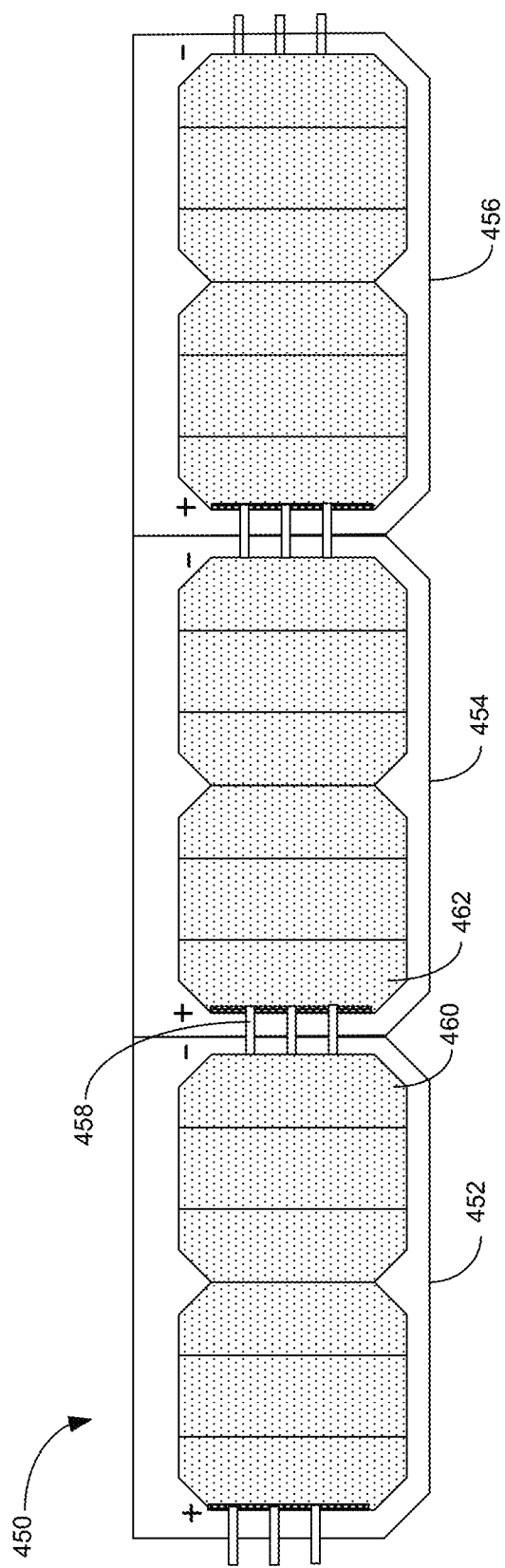
FIG. 4E shows an exemplary configuration of a tile module, according to one embodiment of the present invention.

In addition to the examples shown in FIGS. 4A and 4D, other tile arrangements are also possible to form a solar roof tile module as long as electrical couplings among tiles can be achieved. In some embodiments, instead of parallelly coupling the tiles within a tile module, one can also form serial coupling among the tiles. FIG. 4E shows an exemplary configuration of a tile module, according to one embodiment of the present invention. Tile module 450 can include solar roof tiles 452, 454, and 456. Each tile can include a number (e.g., six) of cascaded solar cell strips arranged in a manner shown in FIGS. 2A and 2B. Furthermore, metal tabs can be used to interconnect photovoltaic strips enclosed in adjacent tiles. For example, metal tab 458 can connect the front side of strip 460 with the back side of strip 462, creating a serial coupling between strips 460 and 462. Although the example in FIG. 4E shows three metal tabs interconnecting the photovoltaic strips, other numbers of metal tabs can also be used. Furthermore, each solar roof tile can contain fewer or more cascaded strips, which can be of various shapes and sizes.

Tile Spacer

In the examples shown in FIGS. 4A-4E, a solar roof tile module can include multiple (e.g., three) tiles that are electrically coupled to each other. In practice, the multiple tiles can also be coupled to each other mechanically in order for them to function as a single unit when being laid on the roof. Although there may be many ways to mechanically couple the tiles within a module, it is desirable to provide a coupling mechanism that does not add shading to the solar cells and does not significantly change the appearance of the solar roof tiles. In some embodiments, a spacer can be inserted between two adjacent solar roof tiles, mechanically coupling together the solar roof tiles. In addition to providing mechanical coupling, the spacer can also provide water leakage at the interface between adjacent tiles.

Figure 5A:
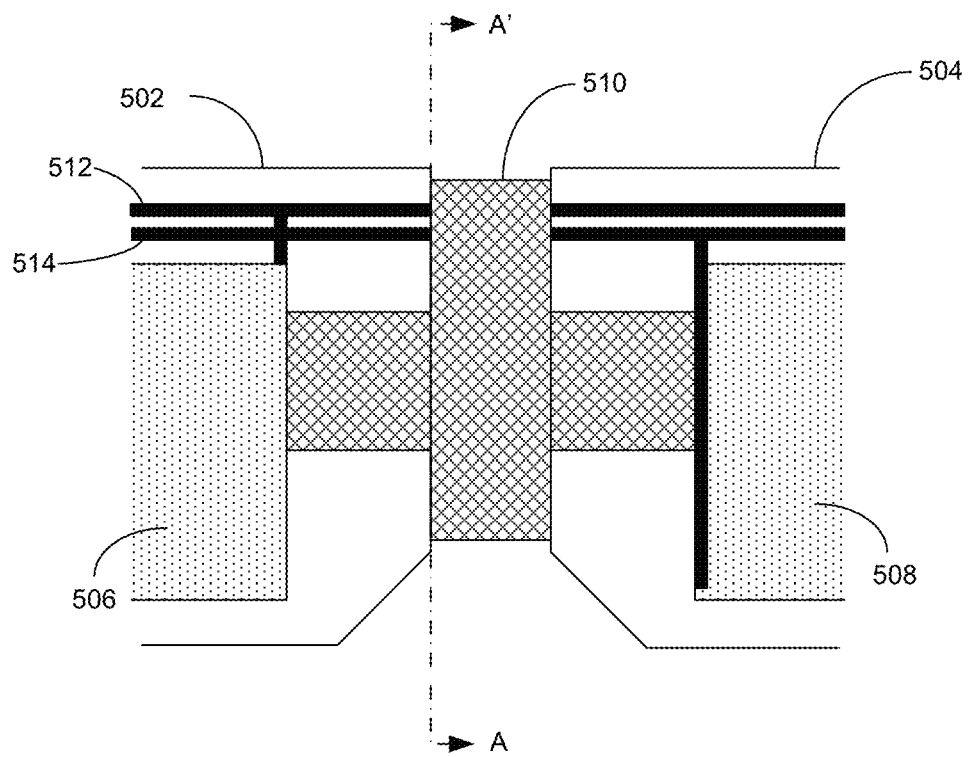
FIG. 5A shows a partial top view of two adjacent solar roof tiles within a solar roof tile module, according to one embodiment.

FIG. 5A shows a partial top view of two adjacent solar roof tiles within a solar roof tile module, according to one embodiment. Solar roof tiles 502 and 504 are coupled to each other via spacer 510. For illustration purposes, spacer 506 is shown with a crosshatch pattern, distinguishing it from other components of the solar roof tiles (e.g., photovoltaic strips and the back cover). In practice, the color of the surface of spacer 510 can be similar to that of the photovoltaic strips (e.g., strips 506 and 508) and the back cover, creating a uniform appearance for the solar roof tile module. In some embodiments, the entire surface of the solar roof tile may appear black in color. Spacer 510 can include a center portion positioned between solar roof tiles 502 and 504 and two wings, each wing being inserted between front and back covers of a solar roof tile. In some embodiments, spacer 510 is designed in such a way that the outer edges of the wings extend near the edges of the photovoltaic strips 506 and 508. It is also possible for the wings to extend beyond the edges of the photovoltaic strips. In such situations, the wings can be placed underneath the photovoltaic strips to prevent shading.

Encapsulant material, such as EVA (ethyl vinyl acetate), can be applied between the two covers. This way, after lamination, the left wing of spacer 510 can be encapsulated within solar roof tile 502 and the right wing of spacer 510 can be encapsulated within solar roof tile 504, thus acting as a bridge that mechanically couples tiles 502 and 504. The size and shape of the spacer can be different than the ones shown in FIG. 5A, as long as a portion of the spacer can be encapsulated within one solar roof tile while another portion of the spacer can be encapsulated within its adjacent solar roof tile. For example, instead of having two side wings with a narrower width, the width of the side wings can be similar to the center portion. Hence, when viewed from above, the spacer may have a rectangular shape.

Materials that can be used to form the spacer need to be mechanically strong and weather resistant. In addition, the spacer needs to be sufficiently flexible to allow small relative movements between the adjacent tiles. In some embodiments, each wing can bend slightly (e.g., in a range between +3° and −3°) to allow relative position shifting of the tiles. For example, the tiles may shift position slightly under strong winds. A flexible spacer can prevent damage to the tiles under such conditions. In some embodiments, the spacer can be made of polytetrafluoroethylene (PTFE), such as Teflon® (registered trademark of the Chemours Company, located at Wilmington, Del.).

FIG. 5A also shows metal tabs 512 and 514 that are used for electrically coupling photovoltaic strings encapsulated within the different tiles. More specifically, the right edge busbar of strip 506 is coupled to metal tab 512 and the left edge busbar of strip 508 is coupled to metal tab 514. As shown in FIG. 5A, in order to provide inter-tile coupling, metal tabs 512 and 514 need to be able to go from one tile to the next, meaning that they need to pass through spacer 510. In some embodiments, spacer 510 is designed in such a way that a recessed space can be created to allow the metal tabs to thread through spacer 510 to reach the adjacent tile. In some embodiments, spacer 510 can be made of a UV-absorbing material in order to protect the metal tabs that thread through spacer 510.

Figure 5B:
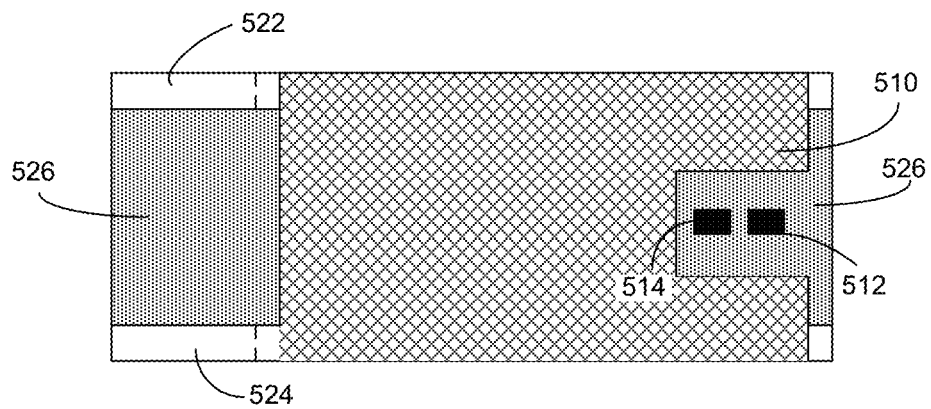
FIG. 5B shows the cross-sectional view along cut plane A-A', according to one embodiment.

FIG. 5B shows the cross-sectional view along cut plane A-A', according to one embodiment. The top and bottom surfaces of spacer 510 can be substantially aligned with the top glass cover 522 and bottom glass cover 524, respectively. Instead of being a solid piece, spacer 510 can include a recessed space near one end. Metal tabs 512 and 514 from one solar roof tile can then thread through spacer 510 via the recessed space to reach the next solar roof tile. Encapsulant 526 can fill the space between top and bottom glass covers 522 and 524. In addition, encapsulant 526 can fill the recessed space of spacer 510, surrounding metal tabs 512 and 514. Subsequent to the lamination, metal tabs 512 and 514 will be held in place by cured encapsulant 526.

Figure 5C:
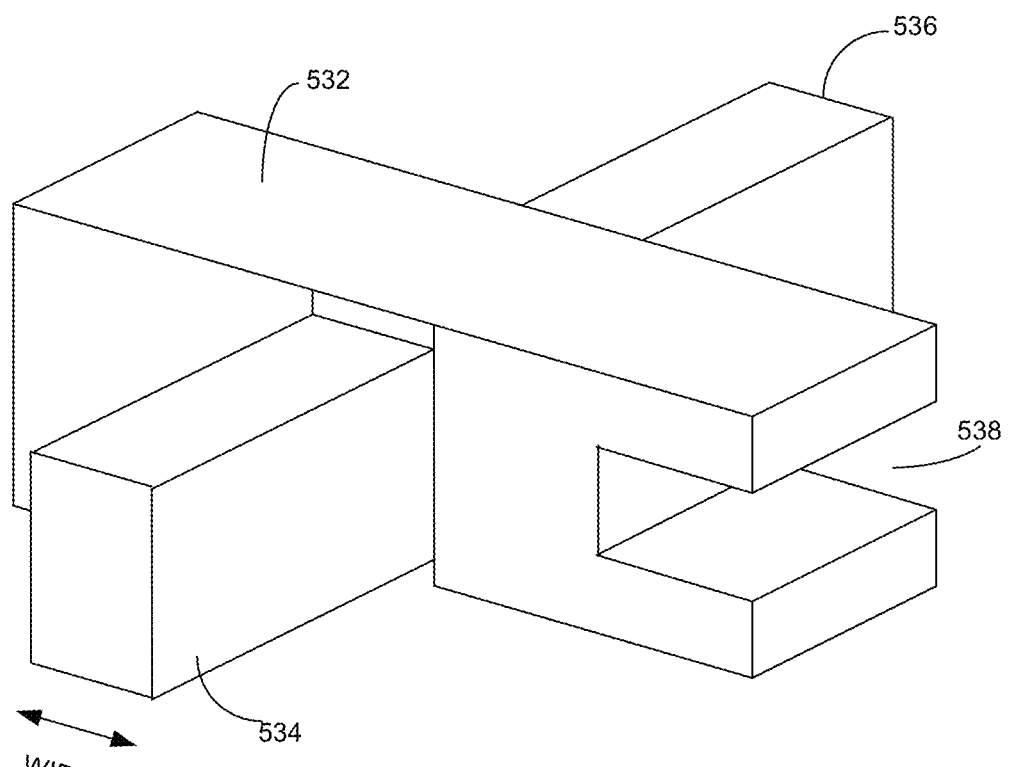
FIG. 5C shows the perspective view of an exemplary spacer, according to one embodiment.
Figure 5D:
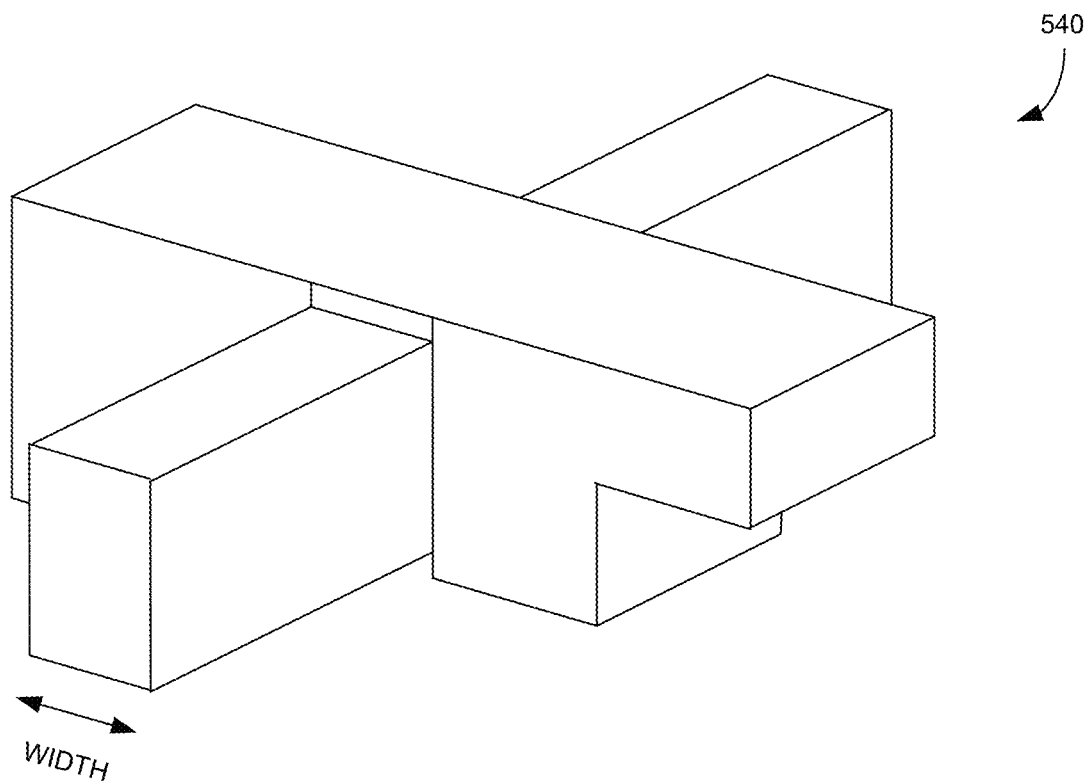
FIG. 5D shows the perspective view of an exemplary spacer, according to one embodiment.
Figure 5E:
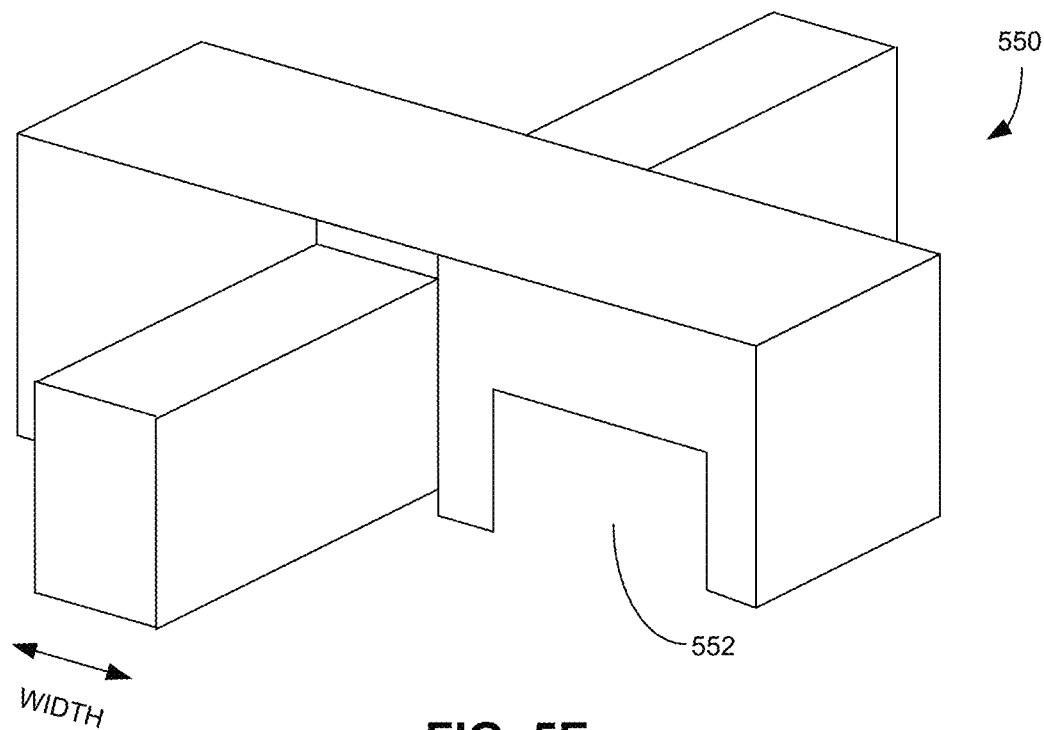
FIG. 5E shows the perspective view of an exemplary spacer, according to one embodiment.

FIG. 5C shows the perspective view of an exemplary spacer, according to one embodiment. In FIG. 5C, spacer 530 can include center portion 532 and side wings 534 and 536. When deployed, center portion 532 can be positioned between two adjacent solar roof tiles, whereas side wings 534 and 536 can be sandwiched between the front and back covers of the two adjacent solar roof tiles. The thickness of the side wings 534 and 536 can be smaller than that of center portion 532 to account for the thickness of the covers. Center portion 532 can include a recessed space 538, which allows metal tabs to thread through to electrically couple the adjacent tiles. The spacer can have a shape that is different than the one shown in FIG. 5C, as long as it allows the passage of the metal tabs. FIG. 5D shows the perspective view of an exemplary spacer, according to one embodiment. The center portion of spacer 540 can include a section that is truncated in height, creating a passageway for the metal tabs to go from one tile to the next. FIG. 5E illustrates one more example of the spacer, according to one embodiment. In FIG. 5E, passageway 552 can be formed in the center portion of spacer 550.

Figure 5F:
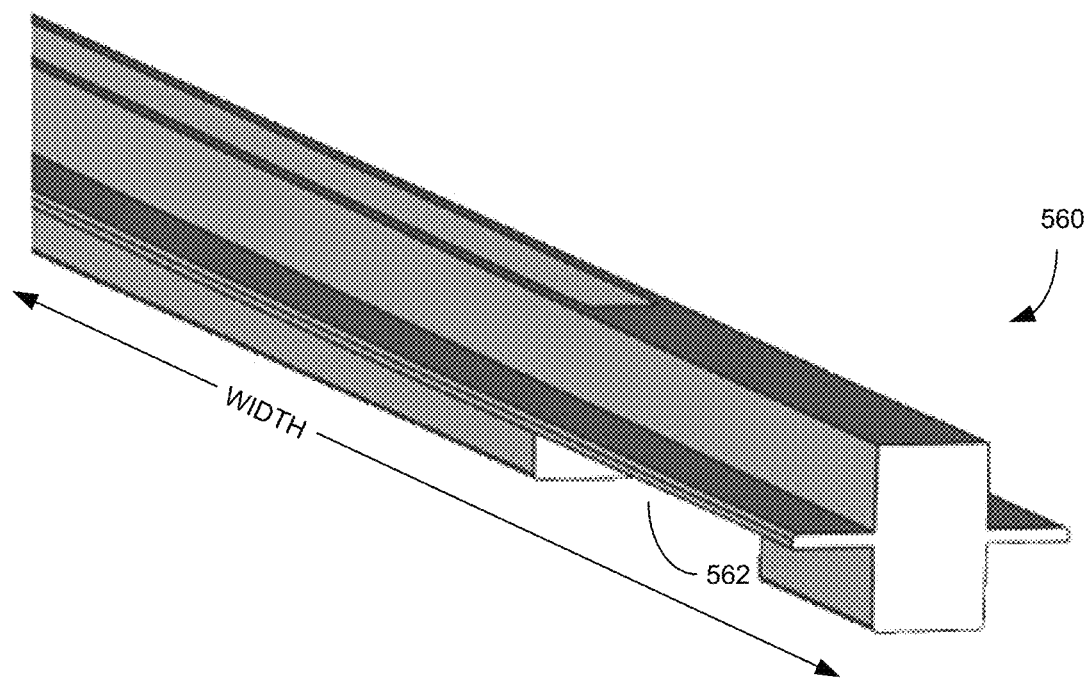
FIG. 5F shows the perspective view of an exemplary spacer, according to one embodiment.

In the examples shown in FIGS. 5C-5E, the width of the side wings is smaller than the width of the center portion. In practice, the side wings can also have the same width as that of the center portion, as shown in FIG. 5F, which illustrates an additional exemplary spacer, according to one embodiment. The wider side wings can provide better protection against water leakage and stronger mechanical coupling. In FIG. 5F, passageway 562 can be formed in the center portion of spacer 560. Note that FIGS. 5A-5F are for illustration purposes only and are not drawn to scale. The dimensions shown in the drawings do not reflect the actual proportions of the spacer.

Inter-Module Coupling

In the examples shown in FIGS. 4A and 4B, the tile module can include multiple interconnected solar roof tiles. More specifically, the solar roof tiles within each module can be electrically coupled in parallel by metal tabs, which are encapsulated inside the tiles together with the photovoltaic strips. External lead wires are needed for inter-module coupling. For example, each solar roof tile can have a positive lead wire and a negative lead wire for outputting power. Depending on the configuration of the solar roof, serial couplings, parallel couplings, or a mixture of both, among the solar roof tiles can be achieved via the external lead wires.

In some embodiments, an external lead wire of a solar module can be achieved by creating through holes at appropriate positions on the back cover of the tiles and by creating electrical contacts to the metal tabs that are encapsulated inside the tiles.

Figure 6A:
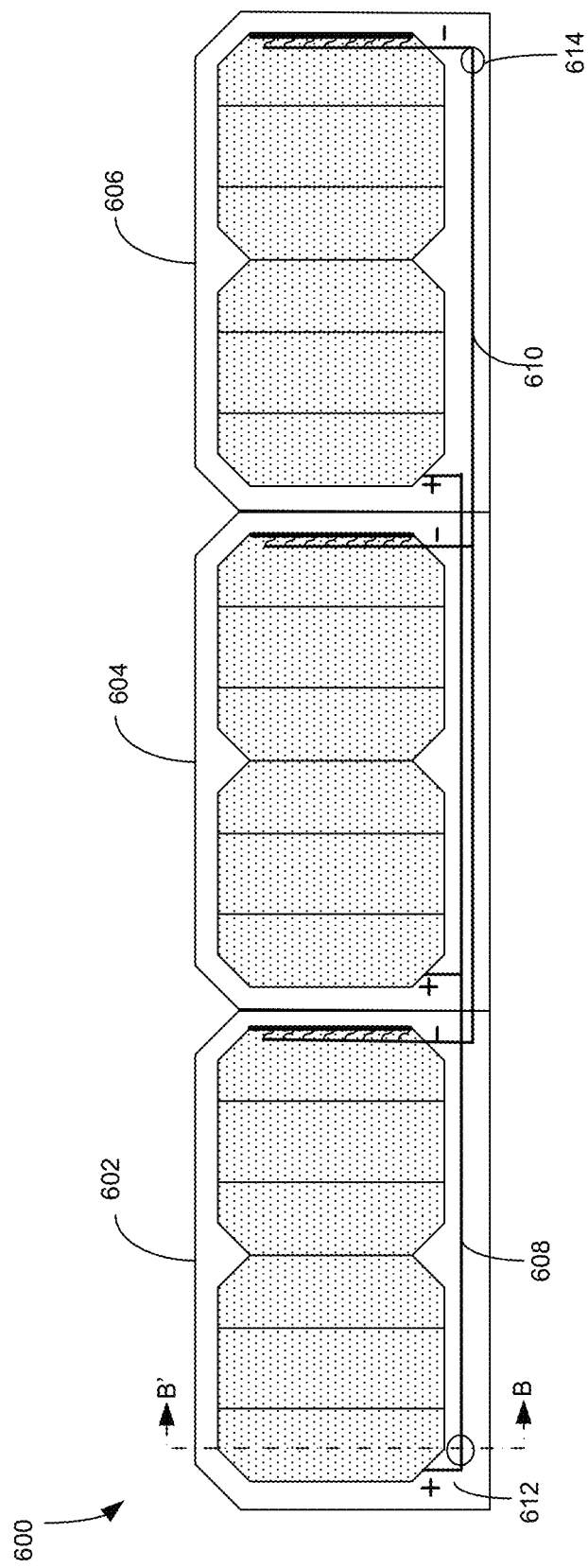
FIG. 6A shows the bottom view of an exemplary tile module, according to one embodiment of the present invention.

FIG. 6A shows the bottom view of an exemplary tile module, according to one embodiment of the present invention. For illustration purposes, the bottom covers of the solar roof tiles are shown as transparent. In practice, the bottom covers typically are non-transparent, such as back sheets or glasses with dark colored coatings. Tile module 600 includes solar roof tiles 602, 604, and 606, and each tile can include a number (e.g., six) of cascaded photovoltaic strips. Metal tabs 608 and 610 couple the solar roof tiles in parallel, such that edge busbars of positive polarity are coupled to metal tab 608 and edge busbars of negative polarity are coupled to metal tab 610. If one views solar roof tile module 600 as a battery, metal tabs 608 and 610 can provide the positive and negative outputs, respectively, of the battery. Hence, by allowing contacts between external lead wires and metal tabs 608 and 610, one can output power from tile module 600 via the external wires. In some embodiments, through holes can be created on the back cover of tile module 600 to enable electrical contacts between a pair of external lead wires and metal tabs 608 and 610.

In FIG. 6A, through holes 612 and 614 are created on the back cover of tiles 602 and 606, respectively. More specifically, through hole 612 can be positioned above a portion of metal tab 608, and through hole 614 can be created beneath a portion of metal tab 610. To prevent encapsulant from filling the through holes, in some embodiments, a gasket (e.g., a rubber or PTFE o-ring) can be inserted into each through hole prior to the lamination process.

Figure 6B:
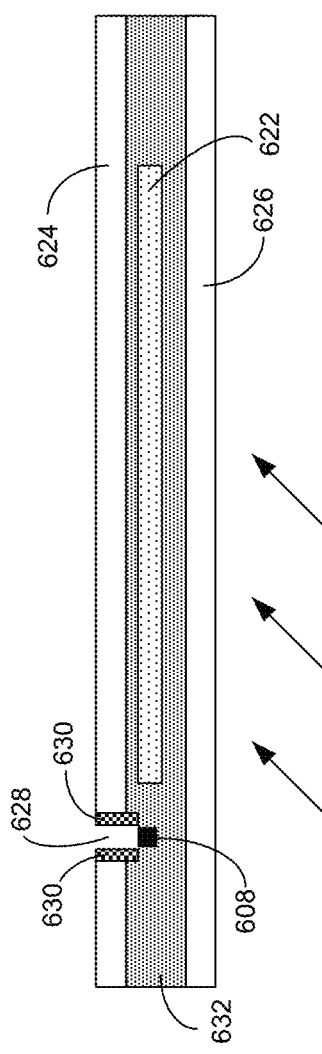
FIG. 6B shows the cross-sectional view along cut plane B-B', according to one embodiment.

FIG. 6B shows the cross-sectional view along cut plane B-B', according to one embodiment. The arrows show the direction of the sunlight. In FIG. 6B, photovoltaic strip 622 is positioned between back cover 624 and front cover 626, and metal tab 608 is positioned adjacent to the front surface of photovoltaic strip 622. Metal tab 608 is coupled to a busbar located on the front surface of photovoltaic strip 622. Through hole 628 is created on back cover 624, directly above a portion of metal tab 608. Gasket 630 is inserted inside through hole 628 to create a clear passage to metal tab 608. Encapsulant 632 can fill the remaining void between front cover 626 and back cover 624. As one can see from FIG. 6B, a clear passage to metal tab 608 can be formed by through hole 628 and gasket 630. By carefully designing the size and shape of gasket 630 to match those of through hole 628, one can prevent contamination of metal tab 608 by encapsulant 632 during lamination.

Figure 6C:
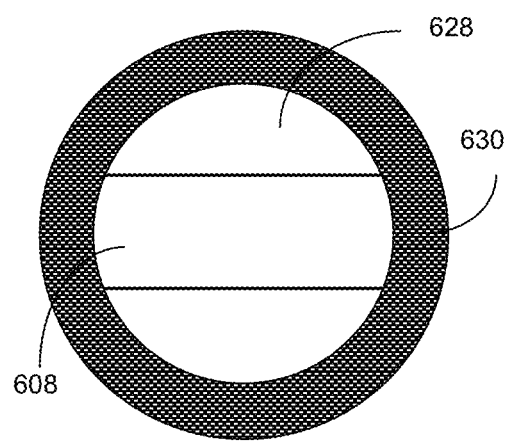
FIG. 6C shows the top view of the through hole, according to one embodiment.
Figure 6D:
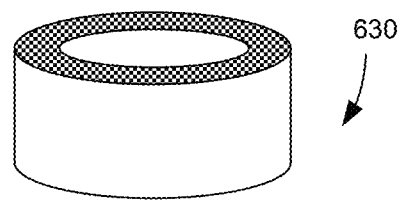
FIG. 6D shows an exemplary gasket, according to one embodiment.

FIG. 6C shows the top view of the through hole, according to one embodiment. In FIG. 6C, a portion of metal tab 608 is exposed via through hole 628. FIG. 6D shows an exemplary gasket, according to one embodiment. In some embodiments, gasket 630 can be similar to an o-ring.

In some embodiments, a specially designed attachment pad (typically made of metal) can be inserted into the gasket. The attachment pad can include a flat (sometimes round) piece for making contact with the exposed portion of the metal tab and an extension post extending beyond the surface of the gasket and the back cover. The busbar of the photovoltaic strip, the metal tab, and the attachment pad together can create a conductive path from one side of the photovoltaic strip to the exterior of the tile. In some embodiments, the extension post of the attachment pad can be enclosed inside a junction box, which can provide electrical insulation and weather protection for the attachment pad.

Figure 7A:
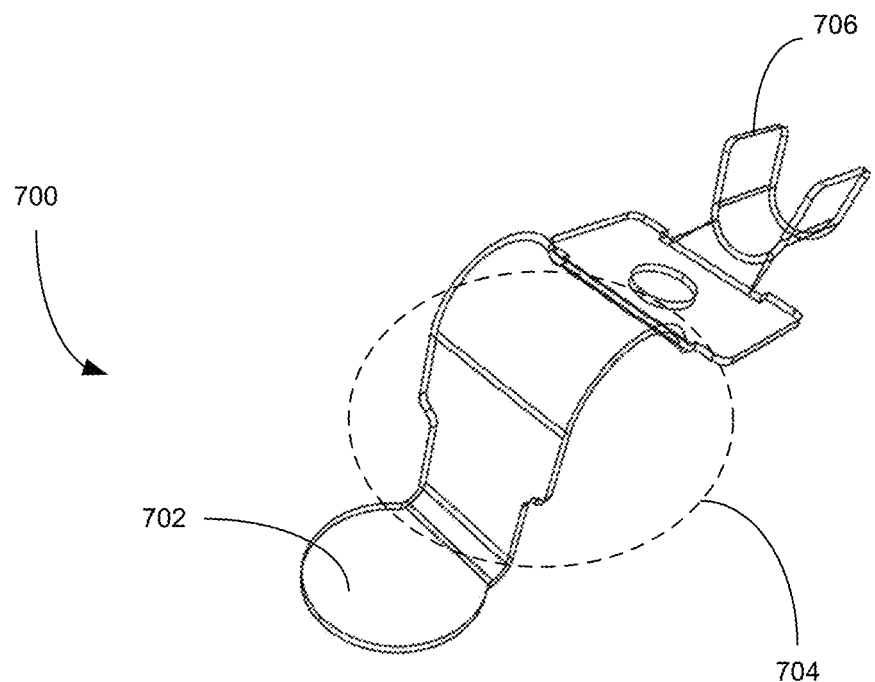
FIG. 7A shows an exemplary attachment pad, according to one embodiment.

FIG. 7A shows an exemplary attachment pad, according to one embodiment. Attachment pad 700 can include contact pad 702, extension post 704, and wire coupler 706. When inserted into the gasket, contact pad 702 can be directly in contact with the exposed portion of a metal tab that is electrically coupled to the busbar of the photovoltaic strips. Extension post 704 can be designed in such a way that its length is greater than the thickness of the back cover. Wire coupler 706 is positioned on the end of extension post 704 and can be configured to couple to a lead wire. Attachment pad 700 can be made of low-resistant metallic materials, such as Cu. In some embodiments, a junction box can be used to protect the attachment pad, more particularly the coupling between wire coupler 706 and the lead wire, from the weather. In addition, the junction box can insulate the attachment pad from other parts of the module, thus preventing leakage or shortening.

Figure 7B:
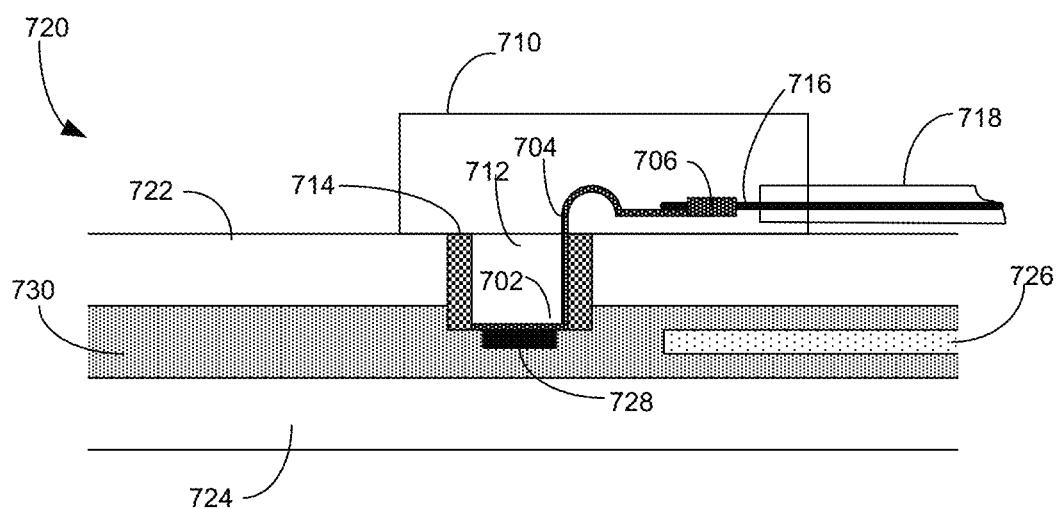
FIG. 7B shows the attachment pad placed inside the junction box, according to one embodiment.

FIG. 7B shows the attachment pad placed inside the junction box, according to one embodiment. More specifically, FIG. 7B shows the amplified view of a solar roof tile at a location near the junction box. Solar roof tile 720 can include back cover 722, front cover 724, and photovoltaic strip 726 encapsulated between back cover 722 and front cover 724. Metal tab 728 is in contact with a busbar (e.g., an edge busbar) on photovoltaic strip 726 and can be used to electrically couple photovoltaic strip 726 with photovoltaic strips encapsulated in adjacent solar roof tiles. Through hole 712 can be formed within back cover 722 at a location directly above a portion of metal tab 728. The location of through hole 712 can be determined based on locations and/or sizes of other components of the solar roof tile module, such as the junction box, the inter-module spacer, etc. Gasket 714 can be inserted into through hole 712, preventing encapsulant 730 from filling through hole 712 during lamination. Encapsulant 730 then fills the remaining empty space between back cover 722 and front cover 724.

Junction box 710 can be placed on back cover 722, directly above through hole 712. An attachment pad can be inserted through gasket 714, resulting in contact pad 702 being in direct physical contact with metal tab 728. In some embodiments, to ensure low-resistance contact, metal tab 728 can include a widened section that is in contact with contact pad 702. Extension post 704 of the attachment pad extends out of through hole 712 into junction box 710. Inside junction box 710, lead wire 716 can be coupled to wire coupler 706 of the attachment pad. In some embodiments, lead wire 716 can include bare copper wire. The coupling can include a metal-to-metal contact. Before exiting junction box 710, lead wire 716 can be inserted into weatherproof jacket 718. Junction box 710 can also be weatherproof. This way, electrical coupling to the photovoltaic strips from the exterior of the solar roof tile module can be provided in a weatherproof manner, thus enabling inter-module coupling.

Figure 8A:
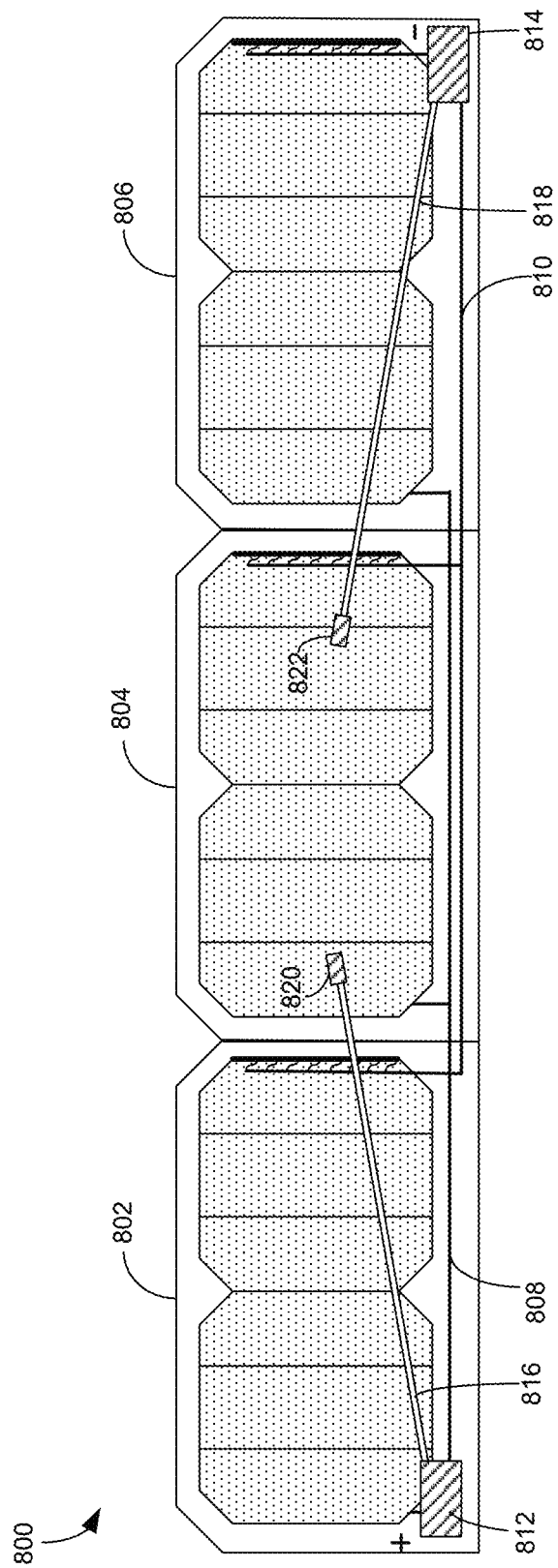
FIG. 8A shows the bottom view of an exemplary tile module with the inter-module coupling cables, according to one embodiment of the present invention.

FIG. 8A shows the bottom view of an exemplary tile module with the inter-module coupling cables, according to one embodiment of the present invention. Solar roof tile module 800 can include three solar roof tiles 802, 804, and 806. In some embodiments, solar roof tiles 802, 804, and 806 can be coupled in parallel via metal tabs 808 and 810. For example, metal tab 808 can be coupled to positive-polarity busbars of all solar roof tiles, whereas metal tab 810 can be coupled to negative-polarity busbars of all solar roof tiles. Solar roof tile module 800 can also include junction boxes 812 and 814, both positioned on the back side of solar roof tile module 800. Similar to junction box 710 shown in FIG. 7B, junction boxes 812 and 814 facilitate electrical coupling between weatherproof lead wires and metal tabs that couple the solar roof tiles. For example, junction box 812 facilitates electrical coupling between weatherproof lead wire 816 and metal tab 808. Similarly, junction box 814 facilitates electrical coupling between weatherproof lead wire 818 and metal tab 810. Therefore, weatherproof lead wires 816 and 818 are electrically coupled to the positive and negative polarities, respectively, of all solar roof tiles. Each weatherproof lead wire can also include a cable coupler, also weatherproof, for coupling to a lead wire of another tile module. Lead wire 816 includes a cable coupler 820, and lead wire 818 includes a cable coupler 822. During roof installation, depending on the layout and electrical design of the roof, an installer can interconnect individual tile modules using the weatherproof lead wires. Additional bussing cables may also be used to facilitate inter-module electrical couplings.

In the example shown in FIG. 8A, the junction boxes are positioned on the back cover of the edge solar roof tiles. For example, junction box 812 is positioned on the back cover of the leftmost solar roof tile 802, and junction box 814 is positioned on the back cover of the rightmost solar roof tile 806. In practice, a junction box can be located anywhere on the back side of the solar roof tile module, as long as the attachment pad within the junction box can have access (e.g., can be in contact with) to the metal tab that interconnects the tiles. The location of the junction boxes sometimes can be constrained by the size or location of other components of the tile module. For example, an inter-module spacer can be inserted between adjacent tile modules to ensure that tile modules laid on a roof can provide complete weather protection. The junction box may need to be placed at a location that can clear the inter-module spacer. For example, instead of being placed near edges of the tile module as shown in FIG. 8A, the junction boxes can be placed away from the edge or near the center of the tile module.

Figure 8B:
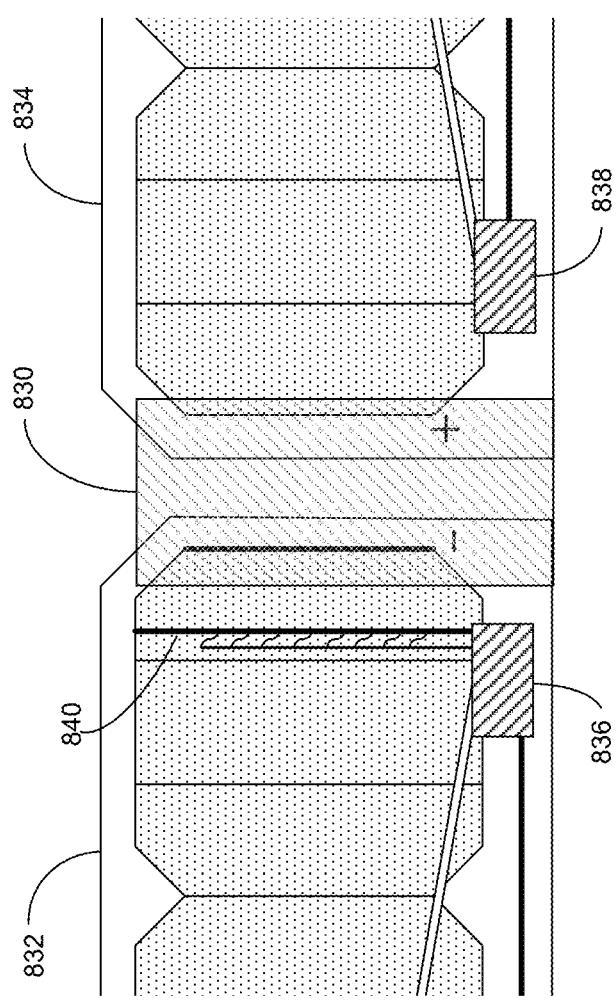
FIG. 8B shows an inter-module spacer positioned between adjacent solar roof tile modules, according to one embodiment.

FIG. 8B shows an inter-module spacer positioned between adjacent solar roof tile modules, according to one embodiment. Inter-module spacer 830 is positioned at the joint location between tile modules 832 and 834. To prevent water leakage, inter-module spacer 830 can partially overlap with the back covers of tile modules 832 and 834. More particularly, a tight coupling between spacer 830 and the back covers is needed. Consequently, junction boxes 836 and 838 need to be placed away from the edge of the corresponding photovoltaic strings, as shown in FIG. 8B. To facilitate direct access to the photovoltaic strips by the attachment pad in the junction box, in some embodiments, an additional busbar (e.g., busbar 840) can be created away from the edge of a corresponding photovoltaic strip.

Tile Module Fabrication

Figure 9:
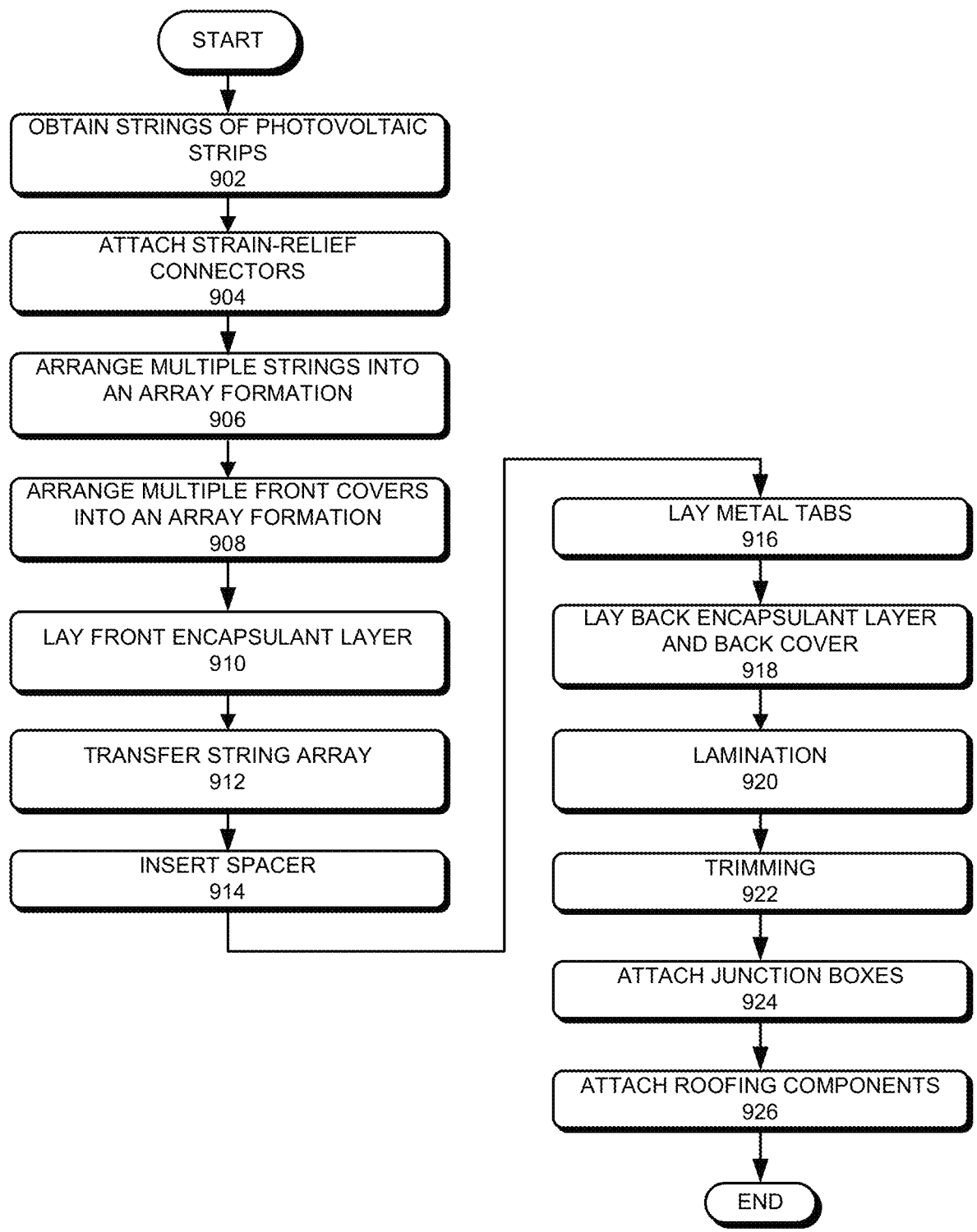
FIG. 9 shows an exemplary fabrication process of a solar roof tile module, according to an embodiment of the invention.

FIG. 9 shows an exemplary fabrication process of a solar roof tile module, according to an embodiment of the invention. During fabrication, strings of photovoltaic strips can be obtained (operation 902). More specifically, photovoltaic strips can be obtained by dividing a standard square or pseudo-square solar cell into multiple pieces, and a string of strips can be formed by cascading multiple strips at the edges. The cascading forms a serial connection among the strips. Detailed descriptions about the formation of a cascaded string of photovoltaic strips can be found in U.S. patent application Ser. No. 14/826,129, entitled "PHOTOVOLTAIC STRUCTURE CLEAVING SYSTEM," filed Aug. 13, 2015; U.S. patent application Ser. No. 14/866,776, entitled "SYSTEMS AND METHODS FOR CASCADING PHOTOVOLTAIC STRUCTURES," filed Sep. 25, 2015; U.S. patent application Ser. No. 14/804,306, entitled "SYSTEMS AND METHODS FOR SCRIBING PHOTOVOLTAIC STRUCTURES," filed Jul. 20, 2015; U.S. patent application Ser. No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015; U.S. patent application Ser. No. 14/866,817, entitled "SYSTEMS AND METHODS FOR TARGETED ANNEALING OF PHOTOVOLTAIC STRUCTURES," filed Sep. 25, 2015; the disclosures of which are incorporated herein by reference in their entirety.

In some embodiments, each individual solar roof tile may include one string, and each string can include six cascaded strips. The outputs of a string are busbars located at opposite sides and edges of the string. Additional busbars may also be added to the string to satisfy the spatial constraints imposed onto the junction boxes. An additional busbar can run alongside an edge busbar but is away from the edge. Subsequent to the formation of a string, stain-relief connectors can be attached to appropriate busbars (e.g., an edge busbar or an additional busbar away from the edge) (operation 904). Various electrical coupling methods can be used to attach the strain-relief connectors to the busbars, including but not limited to: soldering, welding, or bonding with conductive adhesives. Because the busbars can reside on opposite sides of the photovoltaic sting, attaching the strain-relief connectors to the busbars may require that the string be flipped over.

Multiple strings can then be arranged into a matrix or array formation that corresponds to the formation of a tile module (operation 906). For example, to obtain a tile module having three side-by-side tiles (e.g., as shown in FIG. 4A), three strings can be arranged along a straight line, and the distance between adjacent strings can be determined based on the size of the tiles. Similarly, the front cover of multiple solar roof tiles can be arranged into a formation that corresponds to the formation of the tile module (operation 908), and front encapsulant layer can be laid on the cover (operation 910).

In some embodiments, three separate covers, each corresponding to a respective tile, can be used for the tile module. Alternatively, a single piece of glass cover can be used for all three tiles, and gaps can be etched on the glass cover to create the appearance of three individual roof tiles. In a further embodiment, the front cover of the tile module may include three separate pieces of glass, whereas the back cover of the tile module may include a single piece. Similarly, the encapsulant layer can be three separate pieces or a continuous piece of material.

The string array can then be transferred to be on top of the front encapsulation layer and cover (operation 912), and the spacers can be inserted between adjacent tiles (operation 914). Note that the spacer may not be used if both the front and back covers are made of a single piece of glass.

Metal tabs (e.g., metal tabs 410 and 412 shown in FIG. 4A) can then be laid out, directly contacting the strain-relief connectors (operation 916). Subsequently, a back encapsulant layer and a back cover are laid on top of the array of strings (operation 918). In some embodiments, the back encapsulant layer and the back cover of the tile module can include through holes, and gaskets can be inserted inside the through holes. The locations of these through holes correspond to the locations of subsequently attached junction boxes. A lamination process can then be performed to encapsulate the strings, the strain-relief connectors, and the metal tabs between the front and back covers (operation 920). The gaskets inserted into the through holes create a clear path to an exposed metal portion of the metal tabs.

Subsequent to the lamination, the edge of the tile module is trimmed (operation 922) and the junction boxes are attached (operation 924). Attaching a junction box can include inserting an attachment pad within the junction box into the center of the gasket. Other roofing components (e.g., components that can facilitate the attachment of the tile module onto a roof batten) can be attached to the back side of the tile module to complete the fabrication process (operation 926).

The foregoing descriptions of various embodiments have been presented only for purposes of illustration and description. They are not intended to be exhaustive or to limit the invention to the forms disclosed. Accordingly, many modifications and variations will be apparent to practitioners skilled in the art. Additionally, the above disclosure is not intended to limit the invention.

What is claimed is:

1. A solar roof tile module, comprising:
 a plurality of solar roof tiles positioned side by side, wherein the solar roof tiles are electrically and mechanically coupled to each other; and wherein a respective solar roof tile comprises:
a front cover;
a back cover; and
a plurality of photovoltaic strips positioned between the front cover and the back cover, wherein each photovoltaic strip comprises a first edge busbar located on an edge of a first surface and a second edge busbar located on an opposite edge of a second surface, and wherein the photovoltaic strips are arranged in such a way that the first edge busbar of a photovoltaic strip overlaps with a second edge busbar of an adjacent photovoltaic strip, thereby forming a serial connection among the photovoltaic strips; and
one or more tile spacers, wherein a respective tile spacer is positioned between two adjacent solar roof tiles of the plurality of solar roof tiles, thereby preventing water leakage between the two adjacent solar roof tiles;
wherein the two adjacent solar roof tiles separated by the respective tile spacer are electrically coupled to each other via at least a metal tab extending through the respective tile spacer.

2. The solar roof tile module of claim 1, wherein the respective tile spacer is further configured to mechanically couple the two adjacent solar roof tiles.

3. The solar roof tile module of claim 1, wherein the front cover is made of tempered glass.

4. The solar roof tile module of claim 1, further comprising a pair of junction boxes for facilitating electrical coupling between the solar roof tile module and an adjacent solar roof tile module, wherein a junction box is mounted on the back cover of a particular solar roof tile.

5. The solar roof tile module of claim 4, wherein the junction box comprises:
an attachment pad configured to electrically access photovoltaic strips encapsulated inside the particular solar roof tile via a through hole on the back cover of the particular solar roof tile; and
a lead wire electrically coupled to the attachment pad, wherein at least a portion of the lead wire is protected by a weatherproof jacket.

6. The solar roof tile module of claim 1, wherein the respective tile spacer comprises a recessed space configured to provide a passageway for the metal tab.

7. The solar roof tile module of claim 1, wherein the respective solar roof tile further comprises a strain-relief connector configured to electrically couple an exposed edge busbar of the photovoltaic strips to the metal tab.

8. The solar roof tile module of claim 7, wherein the strain-relief connector comprises a plurality of curved metal wires electrically coupled to the exposed edge busbar.

9. The solar roof tile module of claim 1, wherein a respective photovoltaic strip is obtained by dividing a substantially square-shaped photovoltaic structure into n equal pieces, and wherein the solar roof tile module comprises n solar roof tiles.

10. The solar roof tile module of claim 1, wherein the back cover of the respective solar roof tile comprises a back sheet that extends beyond a boundary of the front cover, and wherein an extended portion of the back cover forms a nail strip to facilitate mechanical coupling between the respective solar roof tile and a roof batten.

11. A solar roof tile, comprising:
a front cover;
a back cover;
a plurality of photovoltaic strips positioned between the front cover and the back cover, wherein each photovoltaic strip comprises a first edge busbar located on an edge of a first surface and a second edge busbar located on an opposite edge of a second surface, and wherein the photovoltaic strips are arranged in such a way that the first edge busbar of a photovoltaic strip overlaps with a second edge busbar of an adjacent photovoltaic strip, thereby forming a serial connection among the photovoltaic strips;
a tile spacer positioned at the edge of the solar roof tile, the tile spacer being configured to separate the solar roof tile from an adjacent solar roof tile and to prevent water leakage between the solar roof tile and the adjacent solar roof tile; and
a metal tab configured to extend through the tile spacer to electrically couple the solar roof tile to the adjacent solar roof tile.

12. The solar roof tile of claim 11, wherein the front cover is made of tempered glass.

13. The solar roof tile of claim 11, further comprising an encapsulant layer positioned between the front and back covers, wherein the photovoltaic strips are embedded within the encapsulant layer.

14. The solar roof tile of claim 11, further comprising a strain-relief connector configured to electrically couple an exposed edge busbar of the photovoltaic strips with the metal tab.

15. The solar roof tile of claim 14, wherein the strain-relief connector comprises a plurality of curved metal wires electrically coupled to the exposed edge busbar.

16. The solar roof tile of claim 11, wherein the back cover comprises a back sheet that extends beyond a boundary of the front cover, and wherein an extended portion of the back cover forms a nail strip to facilitate mechanical coupling between the solar roof tile and a roof batten.

* * * * *